US012642089B2

(12) United States Patent
Horng et al.

(10) Patent No.: US 12,642,089 B2
(45) Date of Patent: May 26, 2026

(54) THERMAL RESISTOR AND METHOD OF MANUFACTURING THE SAME

(71) Applicant: TAIWAN SEMICONDUCTOR MANUFACTURING COMPANY, LTD., Hsinchu (TW)

(72) Inventors: Jaw-Juinn Horng, Hsinchu (TW); Szu-Lin Liu, Hsinchu (TW); Wei-Lin Lai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 150 days.

(21) Appl. No.: 18/615,907

(22) Filed: Mar. 25, 2024

(65) Prior Publication Data

US 2024/0266247 A1    Aug. 8, 2024

Related U.S. Application Data

(62) Division of application No. 17/583,158, filed on Jan. 24, 2022, now Pat. No. 11,942,392.

(60) Provisional application No. 63/240,159, filed on Sep. 2, 2021, provisional application No. 63/240,096, filed on Sep. 2, 2021.

(51) Int. Cl.
*H01L 23/367* (2006.01)
*H01L 23/00* (2006.01)

(52) U.S. Cl.
CPC .......... *H01L 23/3677* (2013.01); *H01L 24/45* (2013.01); *H01L 2224/4807* (2013.01); *H01L 2224/48227* (2013.01); *H01L 2924/14* (2013.01)

(58) Field of Classification Search
CPC ...................................................... H01L 22/30
See application file for complete search history.

(56) References Cited

U.S. PATENT DOCUMENTS

| | | | |
|---|---|---|---|
| 7,260,442 B2 | 8/2007 | Hwang et al. | |
| 9,256,709 B2 | 2/2016 | Yu et al. | |
| 2014/0040838 A1 | 2/2014 | Liu et al. | |
| 2015/0278429 A1 | 10/2015 | Chang | |
| 2021/0303812 A1* | 9/2021 | Mainguet ................. | G01K 7/16 |
| 2022/0301953 A1* | 9/2022 | Kwon ................. | H01L 23/5226 |

FOREIGN PATENT DOCUMENTS

| | | |
|---|---|---|
| TW | 201729343 | 8/2017 |
| TW | 201742210 | 12/2017 |

* cited by examiner

*Primary Examiner* — Yu-Hsi D Sun
(74) *Attorney, Agent, or Firm* — Hauptman Ham, LLP

(57) ABSTRACT

An IC device includes a heat transfer structure electrically isolated from a resistor. The resistor includes first and second metal segments extending in a first direction in a first metal layer and a third metal segment extending perpendicular to the first direction in a second metal layer below the first metal layer, the third metal segment electrically connecting the first and second metal segments to each other. The heat transfer structure includes fourth and fifth metal segments extending in the first direction in the first metal layer adjacent to the first and second metal segments, sixth and seventh metal segments extending in the second direction in the second metal layer, each of the sixth and seventh metal segments electrically connecting the fourth and fifth metal segments to each other, and a thermally conductive path extending from the sixth or seventh metal segment to an underlying active area.

20 Claims, 19 Drawing Sheets

500L/500D
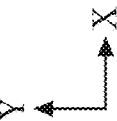
FIG. 5A

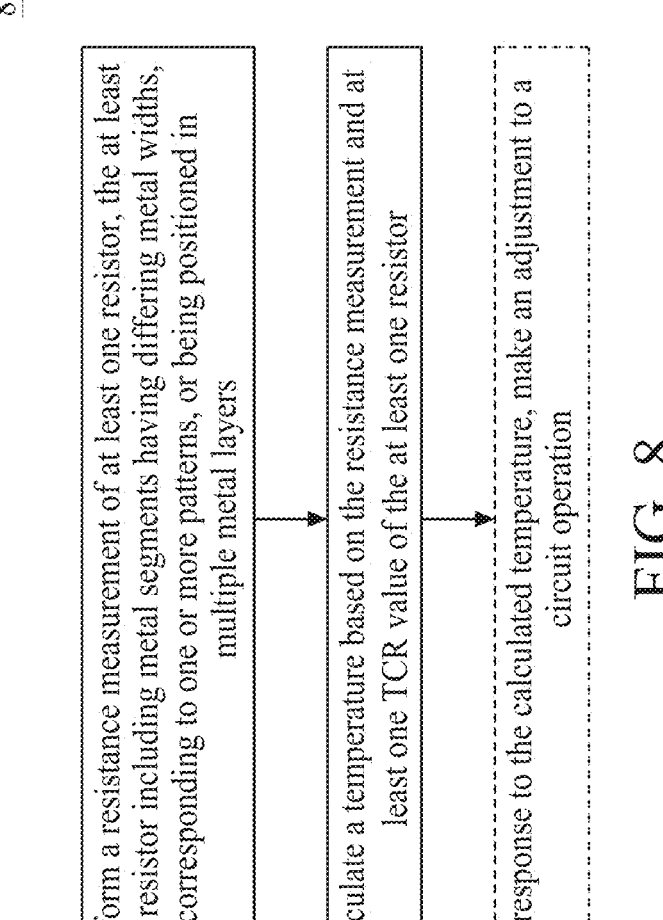

800

Perform a resistance measurement of at least one resistor, the at least one resistor including metal segments having differing metal widths, corresponding to one or more patterns, or being positioned in multiple metal layers

810

Calculate a temperature based on the resistance measurement and at least one TCR value of the at least one resistor

820

In response to the calculated temperature, make an adjustment to a circuit operation

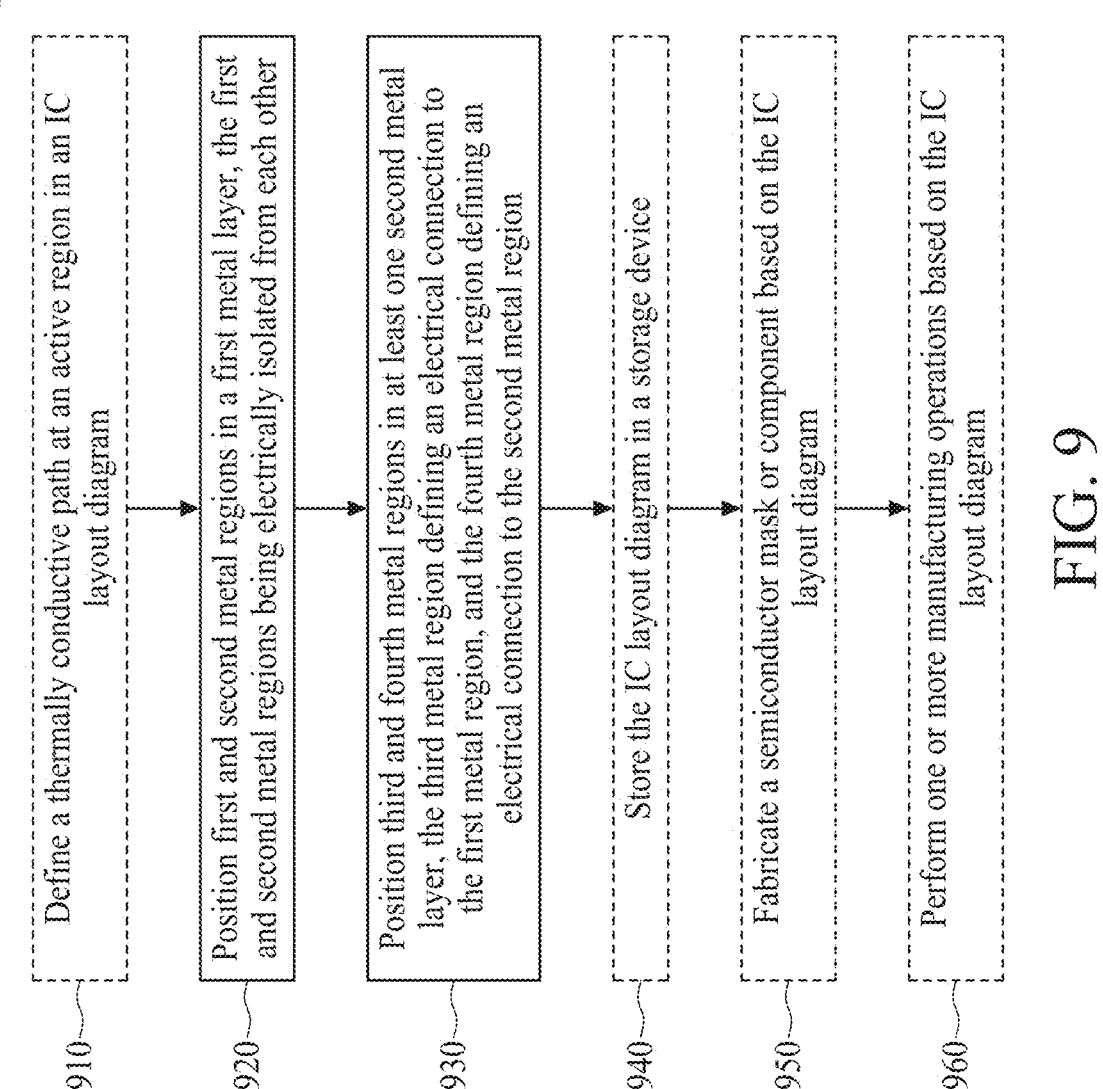

910 — Define a thermally conductive path at an active region in an IC layout diagram 920 — Position first and second metal regions in a first metal layer, the first and second metal regions being electrically isolated from each other 930 — Position third and fourth metal regions in at least one second metal layer, the third metal region defining an electrical connection to the first metal region, and the fourth metal region defining an electrical connection to the second metal region 940 — Store the IC layout diagram in a storage device 950 — Fabricate a semiconductor mask or component based on the IC layout diagram 960 — Perform one or more manufacturing operations based on the IC layout diagram

FIG. 9

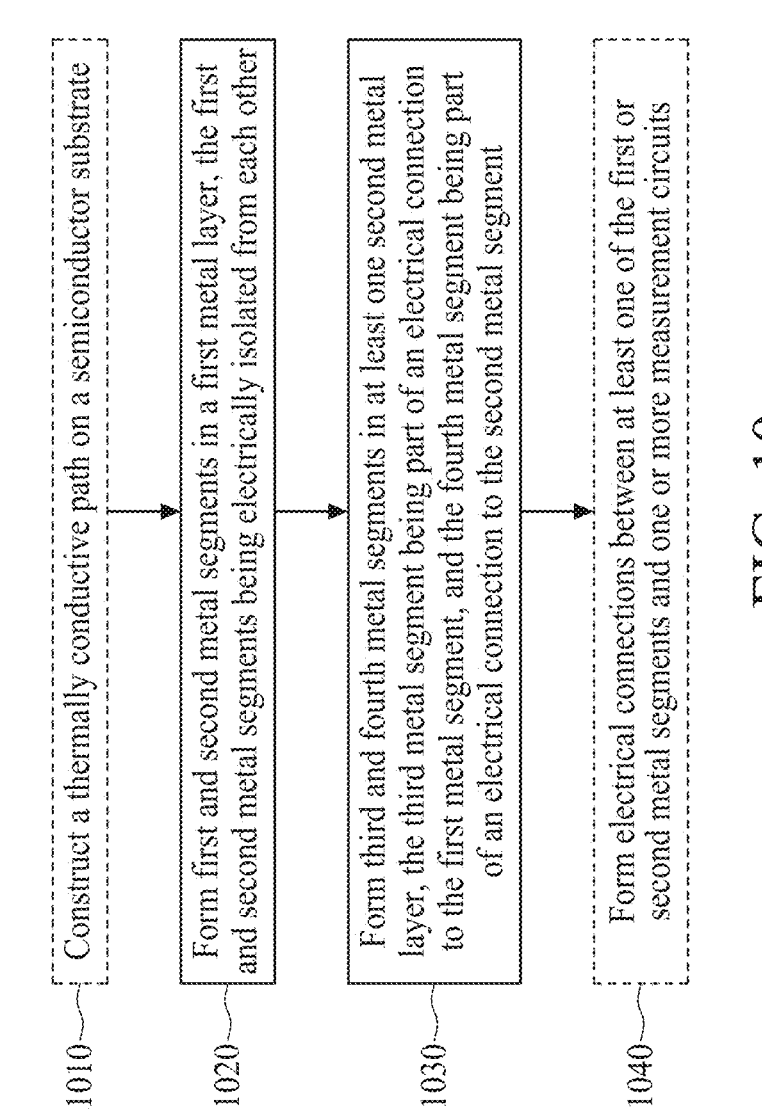

1000

1010 — Construct a thermally conductive path on a semiconductor substrate

1020 — Form first and second metal segments in a first metal layer, the first and second metal segments being electrically isolated from each other 1030 — Form third and fourth metal segments in at least one second metal layer, the third metal segment being part of an electrical connection to the first metal segment, and the fourth metal segment being part of an electrical connection to the second metal segment 1040 — Form electrical connections between at least one of the first or second metal segments and one or more measurement circuits

FIG. 10

THERMAL RESISTOR AND METHOD OF MANUFACTURING THE SAME

PRIORITY CLAIM

The present application is a divisional of U.S. application Ser. No. 17,583,158, filed Jan. 24, 2022, now U.S. Pat. No. 11,942,392, issued Mar. 26, 2024, which claims the priority of U.S. Provisional Application No. 63,240,096, filed Sep. 2, 2021, and U.S. Provisional Application No. 63,240,159, filed Sep. 2, 2021, each of which is incorporated herein by reference in its entirety.

BACKGROUND

Integrated circuits (ICs) inherently have properties that vary as a function of temperature. In some cases, IC operation relies on temperature feedback provided by one or more IC devices. Temperature feedback can be used both to enhance IC performance by adjusting one or more operating parameters and to improve IC reliability by acting to reduce or avoid overheating conditions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5C are diagrams of an IC layout diagram and corresponding IC device, in accordance with some embodiments.

FIG. 8 is a flowchart of a method of operating an IC device, in accordance with some embodiments.

FIG. 9 is a flowchart of a method of generating an IC layout diagram, in accordance with some embodiments.

FIG. 10 is a flowchart of a method of manufacturing an IC device, in accordance with some embodiments.

DETAILED DESCRIPTION

Figure 1A:
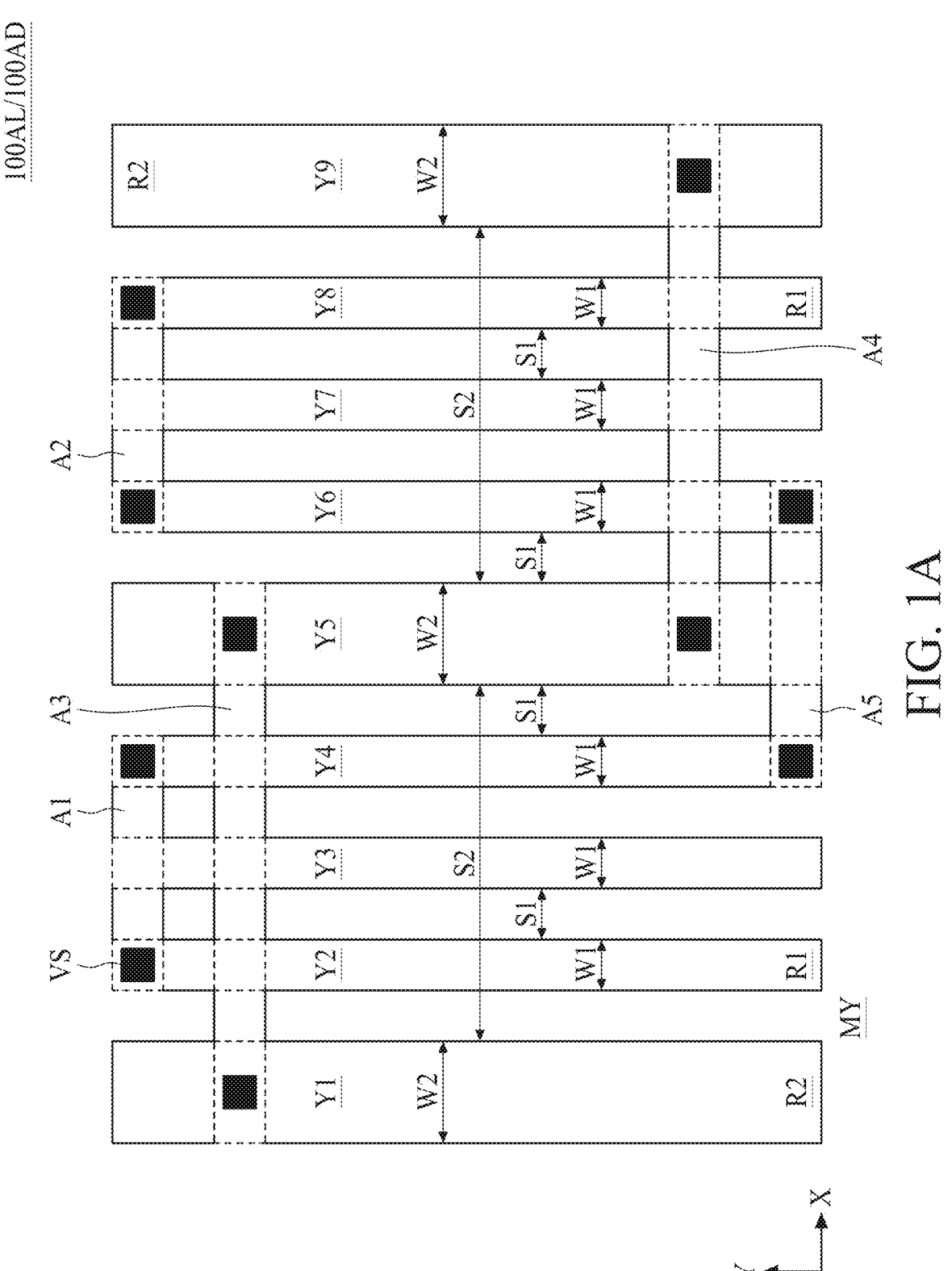
FIGS. 1A-1C are diagrams of an IC layout diagram and corresponding IC device, in accordance with some embodiments.

The following disclosure provides many different embodiments, or examples, for implementing different features of the provided subject matter. Specific examples of components, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an IC device, e.g., a thermal sensor, based on an IC layout diagram includes first and second resistors positioned in a same metal layer, each resistor including at least one metal segment extending in a first direction. The at least one metal segment of the second resistor is wider than the at least one metal segment of the first resistor, and in embodiments in which the resistors include more than one metal segment, the metal segments of the second resistor have a spacing greater than that of the metal segments of the first resistor. The first and second resistors are thereby configured as a resistor pair capable of being used in differential measurements whereby temperature coefficient of resistance (TCR) variations are reduced or substantially canceled out, improving thermal sensor accuracy compared to other approaches. In some embodiments, a resistor of the resistor pair includes elements configured as a thermally conductive path to an underlying structure such that temperatures based on the thermal sensor reflect those of the underlying structure.

In some embodiments, an IC device includes a thermally conductive path between an underlying structure and at least one metal segment that is electrically isolated from one or more resistors such that temperatures reflecting those of the underlying structure are based on the one or more resistors being free from including an electrical connection to the underlying structure. The IC device is thereby capable of being used in temperature measurements in which TCR variations are reduced compared to approaches in which thermal sensors include underlying structure elements, e.g., bipolar junction transistors (BJTs), without thermally conductive paths to overlying structures.

In some embodiments, an IC device includes a resistor or resistor pair including metal segments positioned in one or more metal layers and/or corresponding to one or more patterns of a multiple patterning process, e.g., a double-patterning process such as a self-aligned double-patterning (SALE2) process. The IC device is thereby capable of being used in temperature measurements in which TCR variations corresponding to the one or more metal layers and/or one or more patterns are included in difference and/or averaging techniques, thereby reducing the effect of TCR variations on temperature measurements compared to approaches that are not based on metal segments positioned in one or more metal layers and/or corresponding to one or more patterns of a multiple patterning process.

Figure 1B:
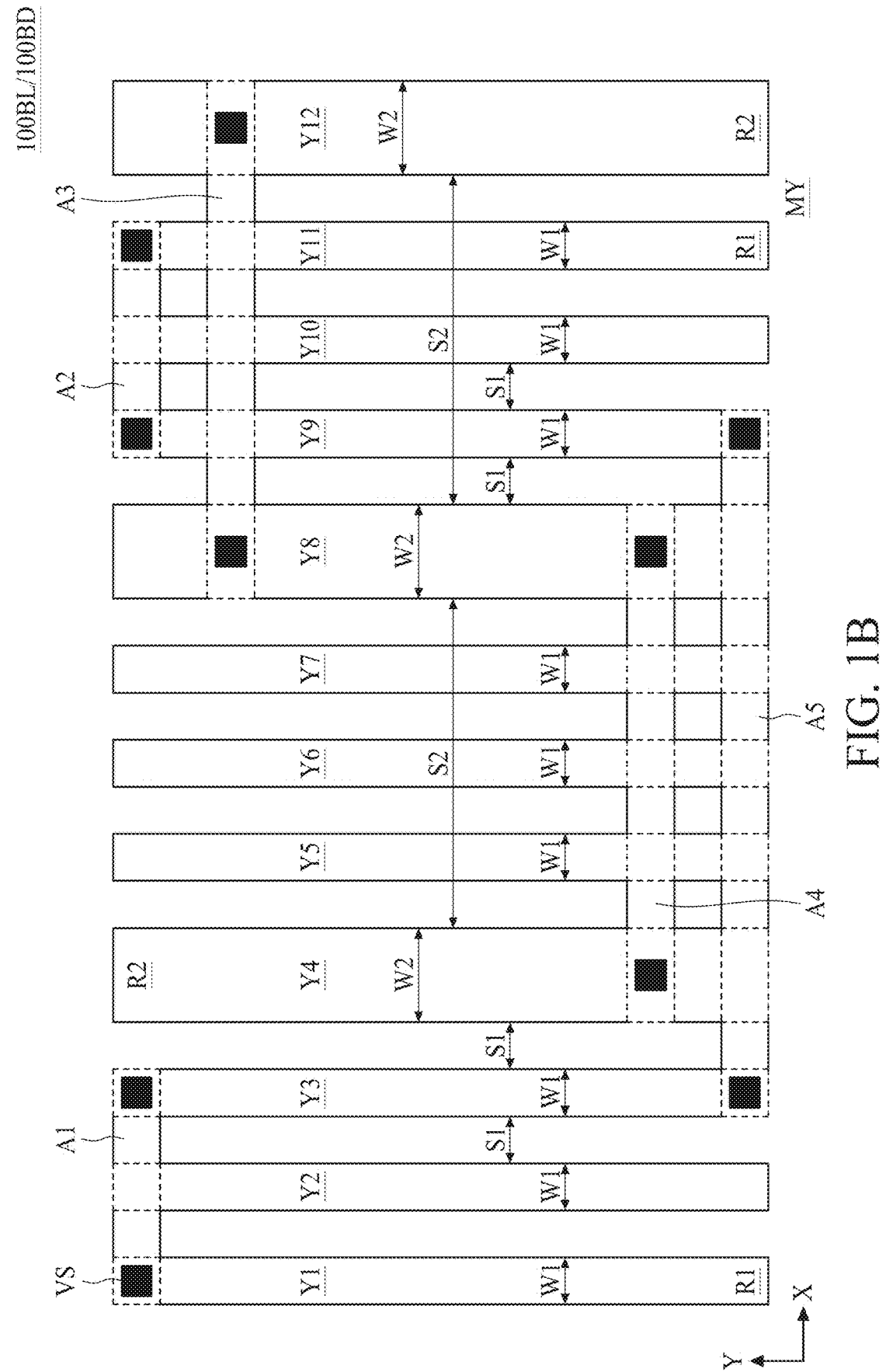
Figure 1C:
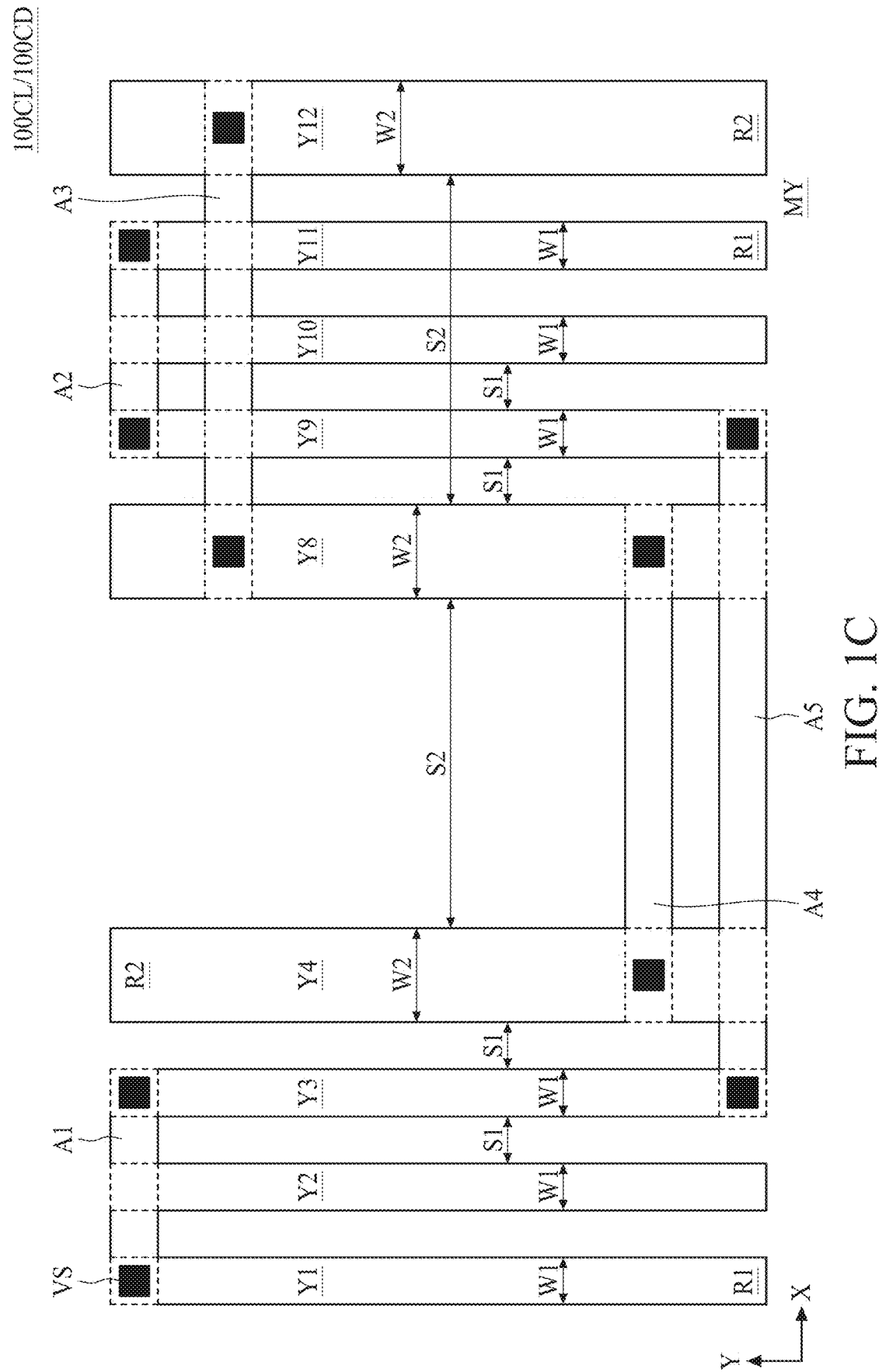
Figure 2A:
FIGS. 2A and 2B are diagrams of an IC layout diagram and corresponding IC device, in accordance with some embodiments.
Figure 2B:
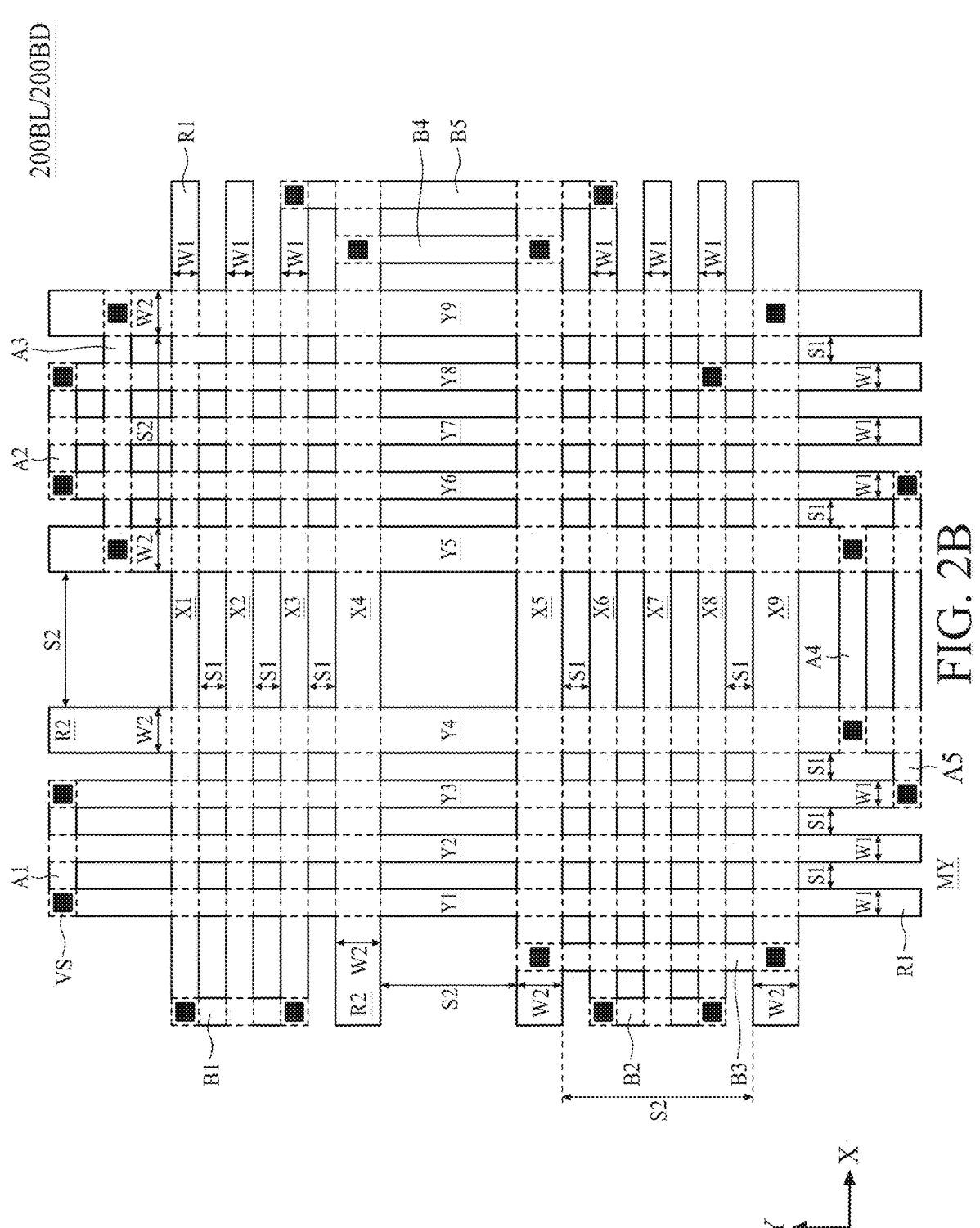
Figure 3A:
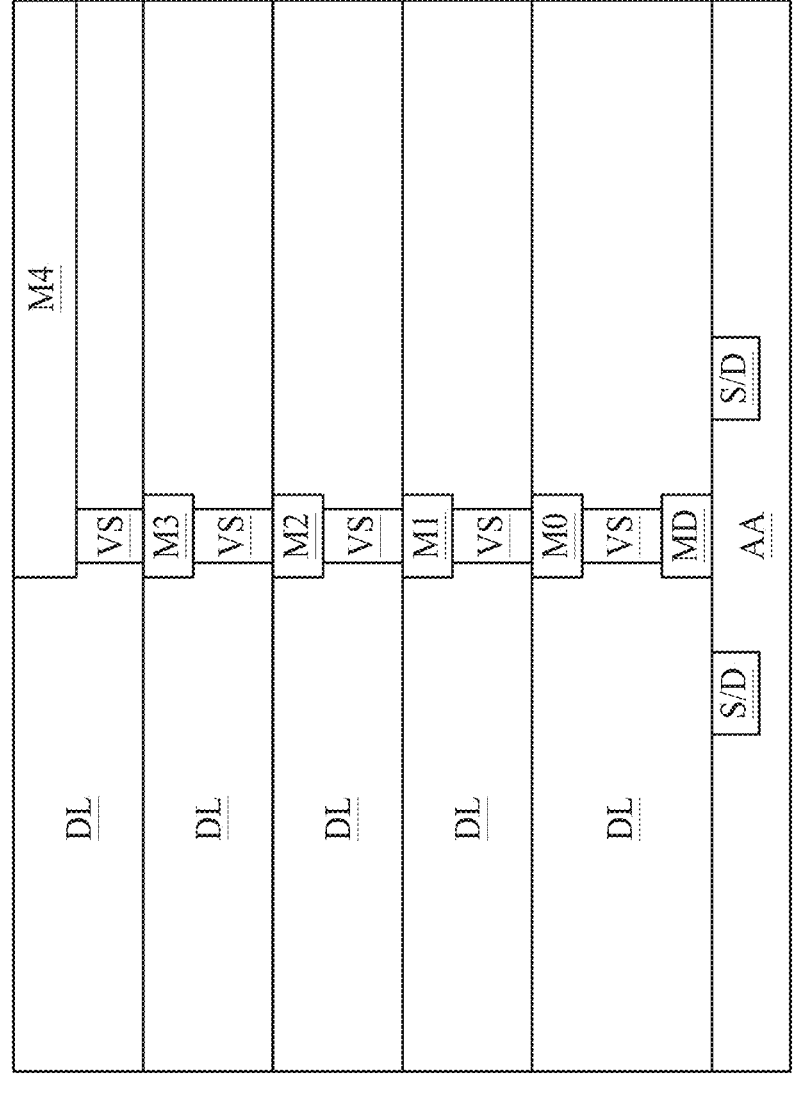
FIGS. 3A and 3B are diagrams of an IC layout diagram and corresponding IC device, in accordance with some embodiments.
Figure 3B:
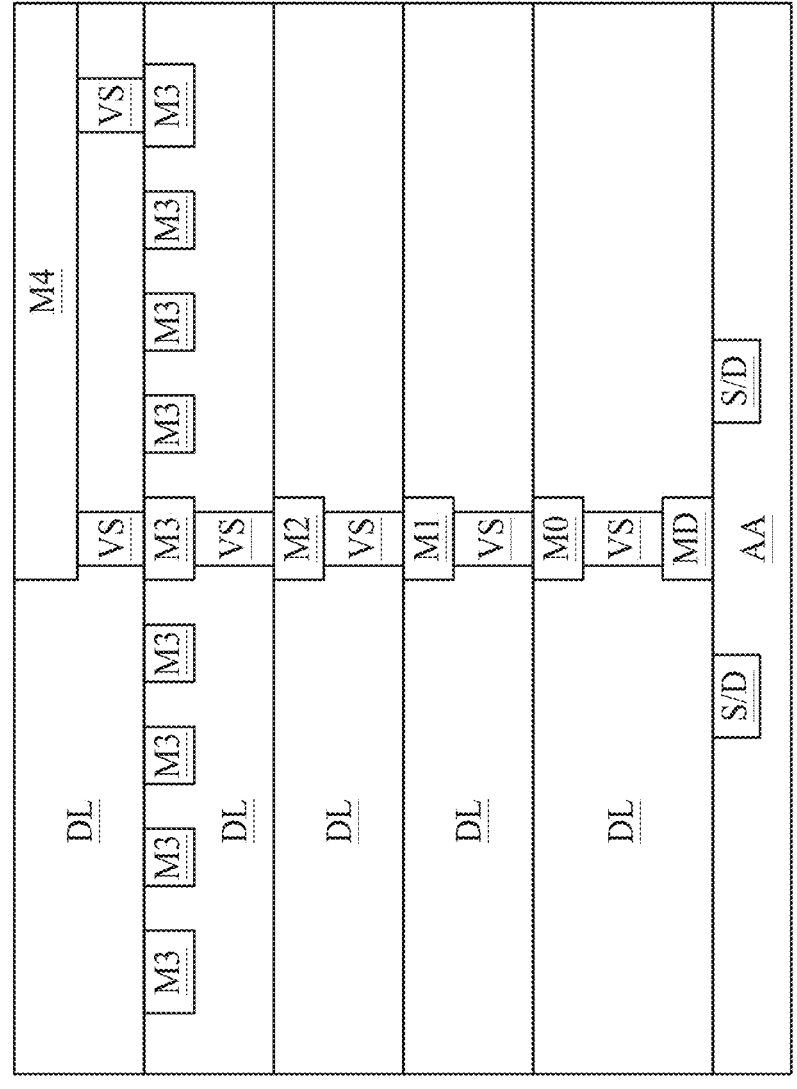

FIGS. 1A-2B and 5A-7 are diagrams of respective IC layout diagrams 100AL-200BL and 500L-700L and corresponding IC devices 100AD-200BD and 500D-700D, in accordance with some embodiments, and FIGS. 3A and 3B are cross-sectional diagrams corresponding to IC layout diagrams 100AL-200BL and IC devices 100AD-200BD, in accordance with some embodiments. Each of IC layout diagrams 100AL-200BL and 500L-700L is one or more electronic files generated by an IC design system, e.g., an IC design system 1100 discussed below with respect to FIG. 11, in accordance with an IC layout generation method, e.g., a method 900 discussed below with respect to FIG. 9.

Each of IC layout diagrams 100AL-200BL and 500L-700L is usable in a manufacturing method, e.g., a method 1000 discussed below with respect to FIG. 10, to construct the corresponding IC device 100AD-200BD or 500D-700D, in some embodiments in accordance with one or more of the cross-sections depicted in FIGS. 3A, 3B, 5B, and 5C. In some embodiments, the manufacturing method is performed using an IC manufacturing system 1200 and an IC manufacturing flow associated therewith as discussed below with respect to FIG. 12.

As discussed below, each of IC devices 100AD-200BD and 500D-700D includes elements of resistors R1 and R2, R3, R4, or R5, and each of IC layout diagrams 100AL-200BL and 500L-700L includes features corresponding to the elements, each of the features and corresponding elements using the same reference designator. Each of FIGS. 1A-2B, 5A, and 6A-7 includes X and Y directions, each of FIGS. 3A, 3B, and 5C includes the X direction and a Z direction, and FIG. 5B includes the Y and Z directions. The orientations depicted in FIGS. 1A-3B and 5A-7 are non-limiting examples provided for the purpose of illustration. In some embodiments, a given one of IC layout diagrams 100AL-200BL or 500L-700L or IC devices 100AD-200BD or 500D-700D has an orientation other than that depicted in FIGS. 1A-3B and 5A-7, e.g., rotated ninety degrees such that the Y direction is translated to the X direction and the X direction is translated to the negative Y direction.

Each of FIGS. 1A-3B and 5A-7 is simplified for the purpose of illustration. The figures are views of IC structures, devices, and layout diagrams with various features included and excluded to facilitate the discussion below. In various embodiments, in addition to the features depicted in FIGS. 1A-3B and 5A-7, an IC structure, device and/or layout diagram includes one or more features corresponding to power distribution structures, metal interconnects, transistors, contacts, vias, gate structures or other transistor elements, isolation structures, or the like.

Each of IC layout diagrams 100AL-200BL and 500L-700L includes some or all of metal regions X1-X10, XA-XJ, Y1-Y12, YA-YD, A1-A5, or B1-B8 corresponding to metal segments X1-X10, XA-XJ, Y1-Y12, YA-YD, A1-A5, and B1-B8 in IC devices 100AD-200BD and 500D-700D, and multiple instances of a via region VS corresponding to instances of a via structure VS in IC devices 100AD-200BD and 500D-700D.

A metal region, e.g., a metal region X1-X10, XA-XJ, Y1-Y12, YA-YD, A1-A5, or B1-B8, is a region in an IC layout diagram, e.g., IC layout diagram 100AL-200BL or 500L-700L, capable of at least partially defining the corresponding metal segment, e.g., metal segment X1-X10, XA-XJ, Y1-Y12, A1-A5, or B1-B8, in a specified metal layer of an IC device manufactured based on the IC layout diagram, e.g., IC device 100AD-200BD or 500D-700D. The corresponding metal segment includes one or more conductive materials, e.g., one or more of copper (Cu), silver (Ag), tungsten (W), titanium (Ti), nickel (Ni), tin (Sn), aluminum (Al) or another metal or material such as for example polysilicon, suitable for providing an electrical connection between IC structure elements having a targeted resistance value. In some embodiments the target resistance value is a range of resistance values around a target value based on one or more tolerance levels of a manufacturing process used to manufacture a given metal segment based on the corresponding metal region.

Each instance of via region VS is a region in the IC layout diagram capable of at least partially defining the corresponding via structure VS in the IC device. The corresponding via structure VS includes one or more conductive materials configured to provide a low resistance electrical path between metal segments positioned in two metal layers, e.g., two adjacent metal layers, of the IC device. In some embodiments, the multiple instances of via structure VS include instances corresponding to multiple pairs of metal layers, e.g., one or more instances configured to electrically connect a metal segment in a given metal layer to a metal segment in an overlying metal layer and one or more instances configured to electrically connect a metal segment in the given metal layer to a metal segment in an underlying metal layer. In some embodiments, a given instance of via structure VS is configured to electrically connect a metal segment in a given metal layer to a metal segment in a non-adjacent metal layer, e.g., a metal layer separated from the given layer by one or more additional metal layers.

In the embodiment depicted in FIG. 1A, IC layout diagram/device 100AL/100AD includes metal regions/segments Y1-Y9 extending in the Y direction in a metal layer MY, and metal regions/segments A1-A5 extending in the X direction in one or more metal layers (not labeled) other than metal layer MY. In some embodiments, metal layer MY is a third metal layer, and the one or more other metal layers is one or both of a second or fourth metal layer. In some embodiments, metal layer MY is a fourth metal layer, and the one or more other metal layers is one or both of a third or fifth metal layer.

Each of metal regions/segments Y2-Y4 and Y6-Y8 has a width W1 in the X direction, and each of metal regions/segments Y1, Y5, and Y9 has a width W2 in the X direction. Each of metal regions/segments Y2-Y4 and Y6-Y8 is separated from each adjacent metal region/segment of metal regions/segments Y1-Y9 in the X direction by a distance S1, and metal region/segment Y5 is separated from each of metal regions/segments Y1 and Y9 in the X direction by a distance S2.

Each of metal regions/segments Y1 and Y5 intersects metal region/segment A3, each of metal regions/segments Y5 and Y9 intersects metal region/segment A4, each of metal regions/segments Y2 and Y4 intersects metal region/segment A1, each of metal regions/segments Y4 and Y6 intersects metal region/segment A5, and each of metal regions/segments Y6 and Y8 intersects metal region/segment A2. Instances of via region/structure VS are positioned at each of the corresponding intersections and are configured to electrically connect the corresponding ones of metal regions/segments Y1-Y9 to the corresponding ones of metal regions/segments A1-A5.

In addition to the intersections discussed above, metal region/segment A1 crosses metal region/segment Y3, metal region/segment A2 crosses metal region/segment Y7, metal region/segment A3 crosses metal regions/segments Y2-Y4, metal region/segment A4 crosses metal regions/segments Y6-Y8, and metal region/segment A5 crosses metal region/segment Y5, each crossing location being free from including an instance of via region/structure VS.

In the embodiment depicted in FIG. 1A, each of metal regions/segments A1-A5 is positioned in a same metal layer adjacent to metal layer MY, and either overlies or underlies metal layer MY in the Z direction. Each instance of via region/structure VS is positioned in a layer, e.g., an interlayer dielectric (ILD) layer, between metal layer MY and the adjacent metal layer, and is thereby configured to electrically connect the corresponding ones of metal regions/segments Y1-Y9 to the corresponding ones of metal regions/segments A1-A5.

In some embodiments, at least one of metal regions/segments A1-A5 is positioned in a metal layer different from one or more metal layers in which one or more other one(s) of metal regions/segments A1-A5 are positioned, and the instances of via region/structure VS are accordingly configured to electrically connect the corresponding ones of metal regions/segments Y1-Y9 to the corresponding ones of metal regions/segments A1-A5. In some embodiments, one or more of metal regions/segments A1-A5 are positioned in one or more metal layers non-adjacent to metal layer MY, and the instances of via region/structure VS are accordingly configured, e.g., by being positioned in two or more ILD layers, to electrically connect the corresponding ones of metal regions/segments Y1-Y9 to the corresponding ones of metal regions/segments A1-A5.

By the configuration discussed above, IC layout diagram/device 100AL/100AD includes a series of metal regions/segments Y2, A1, Y4, A5, Y6, A2, and Y8 electrically connected through instances of via region/structure VS configured as resistor R1 (labeled at each end of the series), and a series of metal regions/segments Y1, A3, Y5, A4, and Y9 electrically connected through instances of via region/structure VS configured as resistor R2 (labeled at each end of the series).

Each metal region/segment Y2, Y4, Y6, and Y8 of resistor R1 positioned in metal layer MY has width W1 and is separated from each corresponding adjacent one of metal regions/segment Y1-Y9 by distance S1. Each metal region/segment Y1, Y5, and Y9 of resistor R2 positioned in metal layer MY has width W2, and metal region/segment Y5 is separated from each of metal regions/segments Y1 and Y9 by distance S2.

IC layout diagram/device 100AL/100AD thereby includes resistors R1 and R2 configured as a differential resistor pair, referred to as a differential thermal sensor in some embodiments. As discussed below, differential resistor pair R1/R2 is thereby capable of being used for temperature-dependent resistance measurements having reduced TCR variations compared to other approaches.

The embodiment depicted in FIG. 1A is a non-limiting example provided for the purpose of illustration. Other configurations of an IC layout diagram/device including resistors R1 and R2 configured as a differential resistor pair, e.g., IC layout diagrams/devices 100BL/100BD-200BL/200BD or 600BL/600BD discussed below, are within the scope of the present disclosure.

In the embodiment depicted in FIG. 1A, each of metal regions/segments A3 and A4 is positioned between metal regions/segments A1/A2 and A5 in the Y direction. In some embodiments, one or both of metal regions/segments A3 or A4 is positioned outside of metal regions/segments A1/A2 and A5 in the Y direction.

In the embodiment depicted in FIG. 1A, IC layout diagram/device 100AL/100AD includes a total of nine metal regions/segments Y1-Y9 in metal layer MY. In some embodiments, IC layout diagram/device 100AL/100AD includes fewer or greater than nine metal regions/segments in metal layer MY.

In the embodiment depicted in FIG. 1A, resistor R1 includes a total of four metal regions/segments in metal layer MY, e.g., metal regions/segments Y1-Y9, having width W1 and electrically connected in series through corresponding three metal regions/segments in the one or more other metal layers, e.g., metal regions/segments A1-A5. In some embodiments, resistor R1 includes fewer or greater than four metal regions/segments in metal layer MY having width W1 and electrically connected in series through corresponding fewer or greater than three metal regions/segments in the one or more other metal layers. In some embodiments, resistor R1 includes a single metal region/segment in metal layer MY having width W1, and does not include a corresponding metal region/segment in the one or more other metal layers.

In the embodiment depicted in FIG. 1A, resistor R2 includes a total of three metal regions/segments in metal layer MY, e.g., metal regions/segments Y1-Y9, having width W2 and electrically connected in series through corresponding two metal regions/segments in the one or more other metal layers, e.g., metal regions/segments A1-A5. In some embodiments, resistor R2 includes fewer or greater than three metal regions/segments in metal layer MY having width W2 and electrically connected in series through corresponding fewer or greater than two metal regions/segments in the one or more other metal layers. In some embodiments, resistor R2 includes a single metal region/segment in metal layer MY having width W2, and does not include a corresponding metal region/segment in the one or more other metal layers.

In the embodiment depicted in FIG. 1A, distance S2 is equal to width W1 multiplied by three plus distance S1 multiplied by four, corresponding to a total of three of metal regions/segments Y2-Y4 or Y6-Y8 uniformly spaced between corresponding metal regions/segments Y1/Y5 or Y5/Y9. In the embodiment depicted in FIG. 1A, each group of three metal regions/segments Y2-Y4 and Y6-Y8 includes a respective metal region/segment Y3 or Y7 electrically isolated from each of resistors R1 and R2 and from each other. In some embodiments, a metal region/segment, e.g., metal region/segment Y3 or Y7, electrically isolated from each of resistors R1 and R2 and from other metal regions/segments is referred to as a dummy metal region/segment.

In some embodiments, distance S2 is equal to width W1 multiplied by a number greater or less than three plus distance S1 multiplied by one greater than the number, corresponding to a total of the number of metal regions/segments having width W1 uniformly spaced between corresponding metal regions/segments having width W2. In some embodiments, a total of one or two regions/segments having width W1 uniformly spaced between corresponding metal regions/segments having width W2 corresponds to IC layout diagram/device 100AL/100AD being free from including a dummy metal region/segment between metal regions/segments having width W2. In some embodiments, a total of more than three regions/segments having width W1 uniformly spaced between corresponding metal regions/segments having width W2 corresponds to IC layout diagram/device 100AL/100AD including more than one dummy metal region/segment between corresponding metal regions/segments having width W2.

In the embodiment depicted in FIG. 1B, IC layout diagram/device 100BL/100BD includes metal regions/segments Y1-Y12 extending in the Y direction in metal layer MY, metal regions/segments A1-A5 extending in the X direction in the one or more other metal layers, and instances of via region/structure VS, the various features corresponding to those discussed above with respect to FIG. 1A. Compared to IC layout diagram/device 100AL/100AD, IC layout diagram/device 100BL/100BD includes the various features of resistors R1 and R2 arranged as discussed below.

In the embodiment depicted in FIG. 1B, each of metal regions/segments Y1-Y3, Y5-Y7, and Y9-Y11 has width W1 and is separated from each adjacent metal region/segment Y1-Y12 by distance S1, each of metal regions/segments Y4, Y8, and Y12 has width W2, and metal region/segment Y8 is separated from each of metal regions/segments Y4 and Y12 by distance S2.

Each of metal regions/segments Y1 and Y3 intersects metal region/segment A1, each of metal regions/segments Y3 and Y9 intersects metal region/segment A5, each of metal regions/segments Y4 and Y8 intersects metal region/segment A4, each of metal regions/segments Y8 and Y12 intersects metal region/segment A3, and each of metal regions/segments Y9 and Y11 intersects metal region/segment A2. The instances of via region/structure VS are positioned at each of the corresponding intersections and are configured to electrically connect the corresponding ones of metal regions/segments Y1-Y12 to the corresponding ones of metal regions/segments A1-A5.

In addition to the intersections discussed above, metal region/segment A1 crosses metal region/segment Y2, metal region/segment A2 crosses metal region/segment Y10, metal region/segment A3 crosses metal regions/segments Y9-Y11, metal region/segment A4 crosses metal regions/segments Y5-Y7, and metal region/segment A5 crosses metal regions/segments Y4-Y8, each crossing location being free from including an instance of via region/structure VS.

By the configuration discussed above, IC layout diagram/device 100BL/100BD includes a series of metal regions/segments Y1, A1, Y3, A5, Y9, A2, and Y11 electrically connected through instances of via region/structure VS configured as resistor R1 (labeled at each end of the series), and a series of metal regions/segments Y4, A4, Y8, A3, and Y12 electrically connected through instances of via region/structure VS configured as resistor R2 (labeled at each end of the series).

Compared to IC layout diagram/device 100AL/100AD in which metal region/segment A5 of resistor R1 crosses a single region/segment Y5 of resistor R2, IC layout diagram/device 100BL/100BD includes metal region/segment A5 of resistor R1 crossing two metal regions/segments Y4 and Y8 of resistor R2.

Compared to IC layout diagram/device 100AL/100AD in which each distance S2 between pairs of consecutive metal regions/segments Y1-Y9 of resistor R2 includes at least one metal region/segment Y1-Y9 of resistor R1, IC layout diagram/device 100BL/100BD includes the distance S2 between metal regions/segments Y4 and Y8 free from including a metal region/segment Y1-Y9 of resistor R1. Instead, an entirety of the metal regions/segments Y5-Y7 positioned in the distance S2 between metal regions/segments Y4 and Y8 are dummy metal regions/segments.

IC layout diagram/device 100BL/100BD thereby includes resistors R1 and R2 configured as differential resistor pair R1/R2 capable of being used for temperature-dependent resistance measurements having reduced TCR variations compared to other approaches, as discussed below.

The embodiment depicted in FIG. 1B is a non-limiting example provided for the purpose of illustration. Other configurations of an IC layout diagram/device including resistors R1 and R2 configured in accordance with the arrangement depicted in FIG. 1B, e.g., including variations analogous to those discussed above with respect to FIG. 1A such as variations in the total numbers of metal regions/segments in one or both of resistors R1 or R2, are within the scope of the present disclosure.

In the embodiment depicted in FIG. 1C, IC layout diagram/device 100CL/100CD includes each of the features of IC layout diagram/device 100BL/100BD with the exception of metal regions/segments Y5-Y7 extending in the Y direction in metal layer MY. Compared to IC layout diagram/device 100BL/100BD, IC layout diagram/device 100CL/100CD thereby includes a distance S2 between pairs of consecutive metal regions/segments of resistor R2, e.g., the distance S2 between metal regions/segments Y4 and Y8, free from including metal regions/segments of resistor R1 and free from including dummy metal regions/segments in metal layer MY.

The embodiment depicted in FIG. 1C is a non-limiting example provided for the purpose of illustration. Other configurations of an IC layout diagram/device including resistors R1 and R2 configured in accordance with the arrangement depicted in FIG. 1C, e.g., including variations analogous to those discussed above with respect to FIGS. 1A and 1B such as variations in the total numbers of metal regions/segments in one or both of resistors R1 or R2, are within the scope of the present disclosure.

In the embodiment depicted in FIG. 2A, IC layout diagram/device 200AL/200AD includes metal regions/segments Y1-Y9 extending in the Y direction in metal layer MY, metal regions/segments A1-A5 extending in the X direction in the one or more other metal layers, and instances of via region/structure VS arranged as discussed above with respect to IC layout diagram/device 100AL/100AD and FIG. 1A.

IC layout diagram/device 200AL/200AD further includes metal regions/segments X1-X9 extending in the X direction in a metal layer MX, metal regions/segments B1-B5 extending in the Y direction in one or more metal layers other than metal layer MX, and additional instances of via region/structure VS. Metal regions/segments X1-X9 and B1-B5 and the additional instances of via region/structure VS are arranged in a configuration equivalent to that of metal regions/segments Y1-Y9 and A1-A5 and the corresponding instances of via region/structure VS, only rotated by ninety degrees.

At an intersection of metal regions/segments Y2 and X8, IC layout diagram/device 200AL/100AD includes an instance of via region/structure VS configured to electrically connect metal region/segment Y2 to metal region/segment X8. At an intersection of metal regions/segments Y9 and X1, IC layout diagram/device 200AL/200AD includes an instance of via region/structure VS configured to electrically connect metal region/segment Y9 to metal region/segment X1.

By the configuration discussed above, IC layout diagram/device 200AL/200AD includes a series of metal regions/segments X2, B4, X4, B1, X6, B5, X8, Y2, A1, Y4, A5, Y6, A2, and Y8 electrically connected through instances of via region/structure VS configured as resistor R1 (labeled at each end of the series), and a series of metal regions/ segments X9, B3, X5, B2, X1, Y9, A4, Y5, A3, and Y1 electrically connected through instances of via region/structure VS configured as resistor R2 (labeled at each end of the series).

In the embodiment depicted in FIG. 2B, IC layout diagram/device 200BL/200BD includes metal regions/segments Y1-Y9 extending in the Y direction in metal layer MY, metal regions/segments A1-A5 extending in the X direction in the one or more other metal layers, and instances of via region/structure VS arranged as discussed above with respect to IC layout diagram/device 100BL/100BD and FIG. 1B.

IC layout diagram/device 200BL/200BD further includes metal regions/segments X1-X9 extending in the X direction in metal layer MX, metal regions/segments B1-B5 extending in the Y direction in the one or more metal layers other than metal layer MX, and additional instances of via region/structure VS. Metal regions/segments X1-X9 and B1-B5 and the additional instances of via region/structure VS are arranged in a configuration equivalent to that of metal regions/segments Y1-Y9 and A1-A5 and the corresponding instances of via region/structure VS, only rotated by ninety degrees.

At an intersection of metal regions/segments Y8 and X8, IC layout diagram/device 200BL/100BD includes an instance of via region/structure VS configured to electrically connect metal region/segment Y8 to metal region/segment X8. At an intersection of metal regions/segments Y9 and X9, IC layout diagram/device 200BL/200BD includes an instance of via region/structure VS configured to electrically connect metal region/segment Y9 to metal region/segment X9.

By the configuration discussed above, IC layout diagram/device 200BL/200BD includes a series of metal regions/segments X1, B1, X3, B5, X6, B2, X8, Y8, A2, Y6, A5, Y3, A1, and Y1 electrically connected through instances of via region/structure VS configured as resistor R1 (labeled at each end of the series), and a series of metal regions/segments X4, B4, X5, B3, X9, Y9, A3, Y5, A4, and Y4 electrically connected through instances of via region/structure VS configured as resistor R2 (labeled at each end of the series).

In each of the embodiments depicted in FIGS. 2A and 2B, metal layers MY and MX are adjacent metal layers. In some embodiments, metal layer MY is a third metal layer and metal layer MX is a fourth metal layer adjacent to the third metal layer. In some embodiments, metal layers MY and MX are non-adjacent metal layers.

In some embodiments, some or all of metal regions/segments A1-A5 are positioned in metal layer MX and/or some or all of metal regions/segments A1-A5 are positioned in one or more metal layers other than metal layer MX. In some embodiments, some or all of metal regions/segments B1-B5 are positioned in metal layer MY and/or some or all of metal regions/segments B1-B5 are positioned in one or more metal layers other than metal layer MY.

In addition to the intersections discussed above with respect to FIGS. 1A-2B, each of IC layout diagrams/devices 200AL/200AD and 200BL/200BD includes multiple locations at which metal regions/segments Y1-Y9 cross metal regions/segments X1-X9 as depicted in FIGS. 2A and 2B, each crossing location being free from including an instance of via region/structure VS.

By the configurations discussed above, each of IC layout diagrams/devices 200AL/200AD and 200BL/200BD includes resistors R1 and R2 configured as differential resistor pair R1/R2 capable of being used for temperature-dependent resistance measurements having reduced TCR variations compared to other approaches, as discussed below.

The embodiments depicted in FIGS. 2A and 2B are non-limiting examples provided for the purpose of illustration. Other configurations of an IC layout diagram/device including resistors R1 and R2 configured in accordance with the arrangements depicted in FIGS. 2A and 2B, e.g., including variations analogous to those discussed above with respect to FIGS. 1A-1C such as variations in the total numbers of metal regions/segments in one or both of resistors R1 or R2, are within the scope of the present disclosure.

In each of the embodiments discussed above, resistor R1 includes at least one of metal regions/segments Y1-Y12 adjacent to at least one of metal regions/segments Y1-Y12 included in resistor R2 in metal layer MY and separated by distance S1. Based on the proximity of the adjacent metal regions/segments Y1-Y12, resistors R1 and R2 are configured to be thermally coupled to each other such that differential resistor pair R1/R2 can reasonably be assumed to have a same temperature in operation.

Each of FIGS. 3A and 3B is a cross-sectional diagram corresponding to IC layout diagrams/devices 100AL/100AD-200BL/200BD, in accordance with some embodiments. The non-limiting example depicted in FIG. 3A includes one of metal regions/segments Y1-Y12 represented as a metal region/segment M3 positioned in metal layer MY being a third metal layer, one of metal regions/segments X1-X9 or A1-A5 represented as a metal region/segment M4 positioned in a metal layer, e.g., metal layer MX, being a fourth metal layer, and an instance of via region/structure VS positioned between metal regions/segments M3 and M4 and configured to electrically connect metal region/segment M3 to metal region/segment M4.

The non-limiting example depicted in FIG. 3B differs from that of FIG. 3A in that more than one of metal regions/segments Y1-Y12 are represented as multiple instances of metal region/segment M3. A first subset of the instances of metal region/segment M3 have width W1 (not labeled in FIG. 3B) and correspond to the groups of three metal regions/segments of metal regions/segments Y1-Y12 discussed above. A second subset of the instances of metal region/segment M3 have width W2 (not labeled in FIG. 3B) and correspond to the metal regions/segments of metal regions/segments Y1-Y12 included, along with two instances of via region/structure VS, in resistor R2 discussed above.

Each of the non-limiting examples depicted in FIGS. 3A and 3B also includes a metal region/segment M2 positioned in a second metal layer, a metal region/segment M1 positioned in a first metal layer, a metal region/segment M0 positioned in a device layer, a conductive region/segment MD positioned in the device layer and contacting an active region/area AA, two instances of a source/drain region/structure S/D, and additional instances of via region/structure VS positioned between and electrically connecting each of the corresponding elements. The device and first through fourth metal layers include instances of a dielectric layer DL in which the corresponding metal regions/segments are positioned.

Metal regions/segments M3 and M4 and the corresponding instance(s) of via region/structure VS are included in resistors R1 and/or R2 in accordance with the embodiments discussed above. Conductive region/segment MD, metal regions/segments M0 through M3, and the corresponding instances of via region/structure VS are thereby configured as an electrically and thermally conductive path between the one of resistors R1 or R2 and active region/area AA. Because conductive region/segment MD, metal regions/segments M0 through M3, and the corresponding instances of via region/structure VS are positioned in the corresponding instances of dielectric layer DL having low thermal conductivity, in operation, a temperature of active region/area AA is effectively communicated to differential resistor pair R1/R2 through the thermally conductive path and the one of resistors R1 or R2.

Active region/area AA, also referred to as an oxide diffusion region/area in some embodiments, including the instances of source/drain region/structure S/D, is a portion of a semiconductor substrate in which one or more active devices, e.g., a fin field-effect transistor (FinFET), a gate-all-around (GAA) transistor, a silicon-on-insulator (SOI) device, a guard ring, or the like, is at least partially located or adjacent. In each of the non-limiting examples of an IC layout diagram/device 100AL/100AD-200BL/200BD depicted in FIGS. 3A and 3B, differential resistor pair R1/R2 is thereby configured to have a temperature representative of that of the one or more active devices.

In some embodiments, an IC layout diagram/device 100AL/100AD-200BL/200BD is otherwise configured to include differential resistor pair R1/R2 configured to have a temperature representative of that of one or more active devices, e.g., by including fewer or a greater number of metal layers than those depicted in FIGS. 3A and 3B, or by the thermally conductive path including a portion of a gate structure instead of conductive region/segment MD. In some embodiments, an IC layout diagram/device 100AL/100AD-200BL/200BD does not include elements configured as a thermally conductive path.

Figure 4:
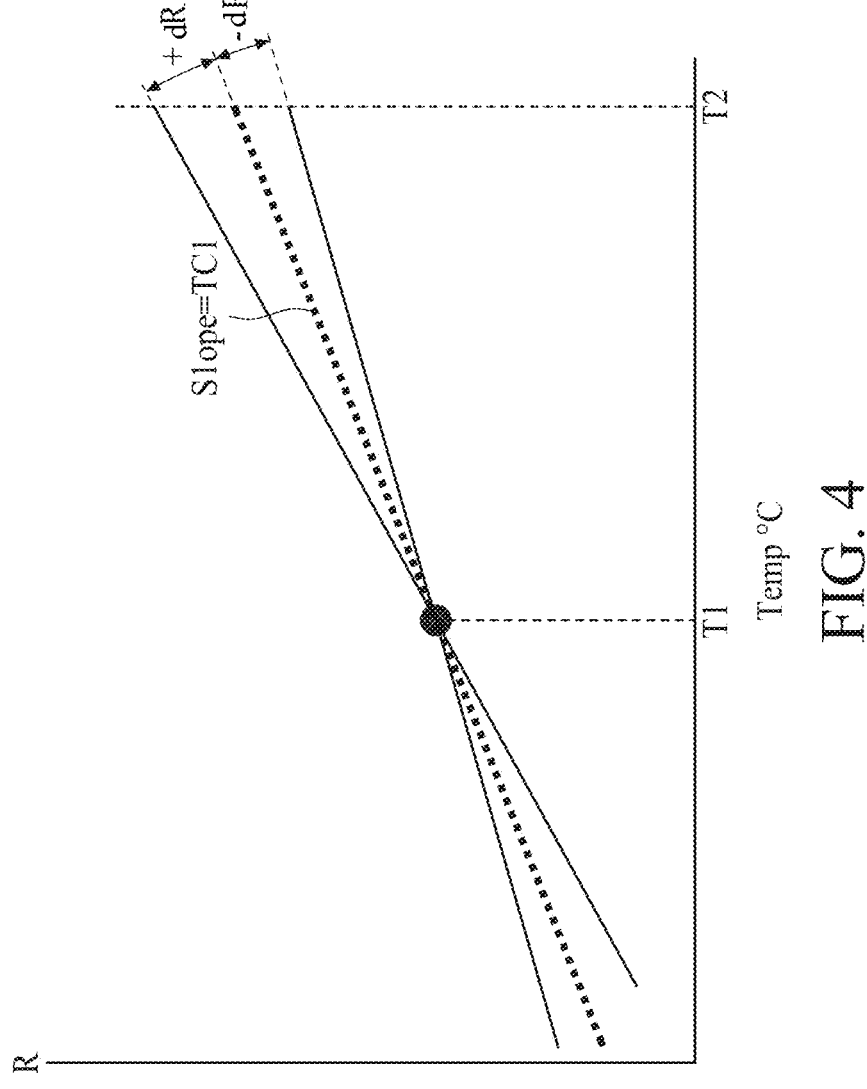
FIG. 4 is a diagram of IC device operating parameters, in accordance with some embodiments.

FIG. 4 is a diagram of IC device operating parameters, in accordance with some embodiments. FIG. 4 includes a plot of temperature on the x-axis and resistance on the y-axis as an example of a resistance-temperature relationship in which a resistance R increases linearly with respect to a temperature (labeled Temp, in degrees Celsius (° C.)).

FIG. 4 represents data from a population of metal resistors, e.g., instances of resistor R1 or R2 discussed above. Based on manufacturing process variations, resistors of the population have a range of resistance values and a range of TCR values. The heavy dashed line represents a population average resistance R as a function of temperature, and the slope of the heavy dashed line corresponds to an average TCR (represented as TC1) relative to a reference temperature T1. In some embodiments, using the single temperature T1 as the reference temperature is referred to as a one-point calibration.

The range of TCR values of the resistor population has a standard deviation s such that the range of resistance values at a second temperature T2 is given by the average resistance value indicated by the heavy dashed line plus or minus a value dR. In some embodiments, the second temperature T2 is a maximum specified operating temperature of an IC including or thermally coupled to a resistor of the resistor population, e.g., resistor R1 or R2. In some embodiments, the second temperature T2 is equal to 125° C.

In the embodiment depicted in FIG. 4, value dR is based on a 3s value of TC1 for the purpose of illustration. dR values based on other standard deviation multiples, e.g., a 4s value of TC1, are within the scope of the various embodiments.

As the TCR standard deviation s of the resistor population increases, the range of resistance values at a given temperature increases. Accordingly, a temperature value derived from a resistance measurement of a resistor in the population (compared to a reference resistance value at temperature T1) has a potential error that also increases as the TCR standard deviation s increases.

For the resistor population of FIG. 4, a 3s resistance value at temperature T2 is given by:

$$R(T2) = R(T1) \times [1 + (TCR + 3s) \times dT] \tag{1}$$

where R(T1) is the resistance value at reference temperature T1, and dT=T2−T1.

Manufacturing process variations are location dependent such that IC device elements in close proximity have highly correlated dimensional process variations. Thus, 3 s values of IC devices including close-proximity elements can reasonably be assumed to be equal.

Accordingly, in the embodiments discussed above, the respective 3s resistance values of close-proximity resistors R1 and R2 at temperature T2 are given by:

$$R1(T2) = R1(T1) \times [1 + (TCR1 + 3s) \times dT] \tag{2}$$

$$R2(T2) = R2(T1) \times [1 + (TCR2 + 3s) \times dT] \tag{3}$$

where R1(T1) and R2(T1) are the respective resistance values at reference temperature T1, and TCR1 and TCR2 are the respective TCRs of resistors R1 and R2.

A difference in the 3s resistance values of resistors R1 and R2 at temperature T2 (R1(T2)−R2(T2)) is thereby expressed as:

$$dR1(T1) + [R1(T1) \times TCR1 + \tag{4}$$
$$R1(T1) \times 3s - R2(T1) \times TCR2 - R2(T1) \times 3s] \times dT$$

where dR1(T1)=R1(T1)−R2(T1).

In some embodiments, resistors R1 and R2 have equal resistance values at temperature T1 such that R1(T1)=R2(T1), dR1(T1)=0, and the difference in the 3s resistance values is given by:

$$R1(T2) - R2(T2) = R1(T1) \times (TCR1 - TCR2) \times dT \tag{5}$$

In such embodiments, TCR variations (as represented by the 3s term) are seen to be cancelled out such that differential resistance values of differential resistor pair R1/R2 at temperature T2 are substantially independent of TCR variations.

In some embodiments, resistance values of resistors R1 and R2 are not equal and instead have values that are close to each other, e.g., within a same order of magnitude. In such embodiments, the contribution of TCR variations on the differential resistance values of differential resistor pair R1/R2 at temperature T2 is substantially reduced compared to approaches that do not include differential resistor pair R1/R2.

In each of these embodiments, the cancellation of or substantial reduction in the effect of TCR variations is achieved based on the substantially equal 3 s (or other multiple) values realized by the proximity and arrangement of resistors R1 and R2 in IC layout diagrams/devices 100AL/100AD-200BL/200BD discussed above with respect to FIGS. 1A-3B.

Both resistance and TCR are functions of the dimensions and arrangement of metal resistors in ICs, e.g., back end of line (BEOL) resistors such as resistors R1 and R2. For a given resistor arrangement, as metal line width increases, a resistance value decreases and a TCR value increases. In some embodiments, the TCR value also increases as metal line spacing increases.

As illustrated by Equation 5, corresponding to the case in which R1(T1)=R2(T1), the differential resistance measurement at the second temperature T2 has the value R1(T2)–R2(T2) defined as a linear function of the TCR difference TCR1–TCR2. Accordingly, as the TCR difference TCR1–TCR2 increases, the differential resistance measurement at the second temperature T2 has a magnitude that increases such that measurement sensitivity also increases. In cases in which resistors R1 and R2 have values that are close to each other, the magnitude of the differential resistance measurement at the second temperature T2 similarly increases as the TCR difference TCR1–TCR2 increases, but the effect is reduced compared to the case in which R1(T1)=R2(T1).

In some embodiments, differential resistor pair R1/R2 is configured to have the TCR difference value ranging from 500 ppm/° ° C. to 1500 ppm/° ° C. In some embodiments, differential resistor pair R1/R2 is configured to have the TCR difference value ranging from 700 ppm/° C. to 1000 ppm/° C. Other TCR difference values are within the scope of the various embodiments.

In some embodiments, the TCR difference value is based on TCR1 of resistor R1 having a value ranging from 1200 ppm/° ° C. to 2400 ppm/° ° C. In some embodiments, the TCR difference value is based on TCR1 of resistor R1 having a value ranging from 1500 ppm/° ° C. to 2000 ppm/° ° C. Other TCR1 values are within the scope of the various embodiments.

In some embodiments, the TCR difference value is based on TCR2 of resistor R2 having a value ranging from 500 ppm/° ° C. to 1500 ppm/° C. In some embodiments, the TCR difference value is based on TCR2 of resistor R2 having a value ranging from 800 ppm/° ° C. to 1200 ppm/° C. Other TCR2 values are within the scope of the various embodiments.

In some embodiments, the TCR difference value is based on TCR1 of resistor R1 having a value based on a value of width W1. In some embodiments, TCR1 is based on width W1 of resistor R1 having a value ranging from 10 nanometers (nm) to 30 nm. In some embodiments, the TCR difference value is based on width W1 of resistor R1 having a value ranging from 15 nm to 20 nm. Other values of width W1 are within the scope of the various embodiments.

In some embodiments, the TCR difference value is based on TCR2 of resistor R2 having a value based on a value of width W2. In some embodiments, TCR2 is based on width W2 of resistor R2 having a value ranging from 10 nm to 500 nm. In some embodiments, the TCR difference value is based on width W2 of resistor R2 having a value ranging from 18 nm to 250 nm. Other values of width W2 are within the scope of the various embodiments.

Figure 5B:
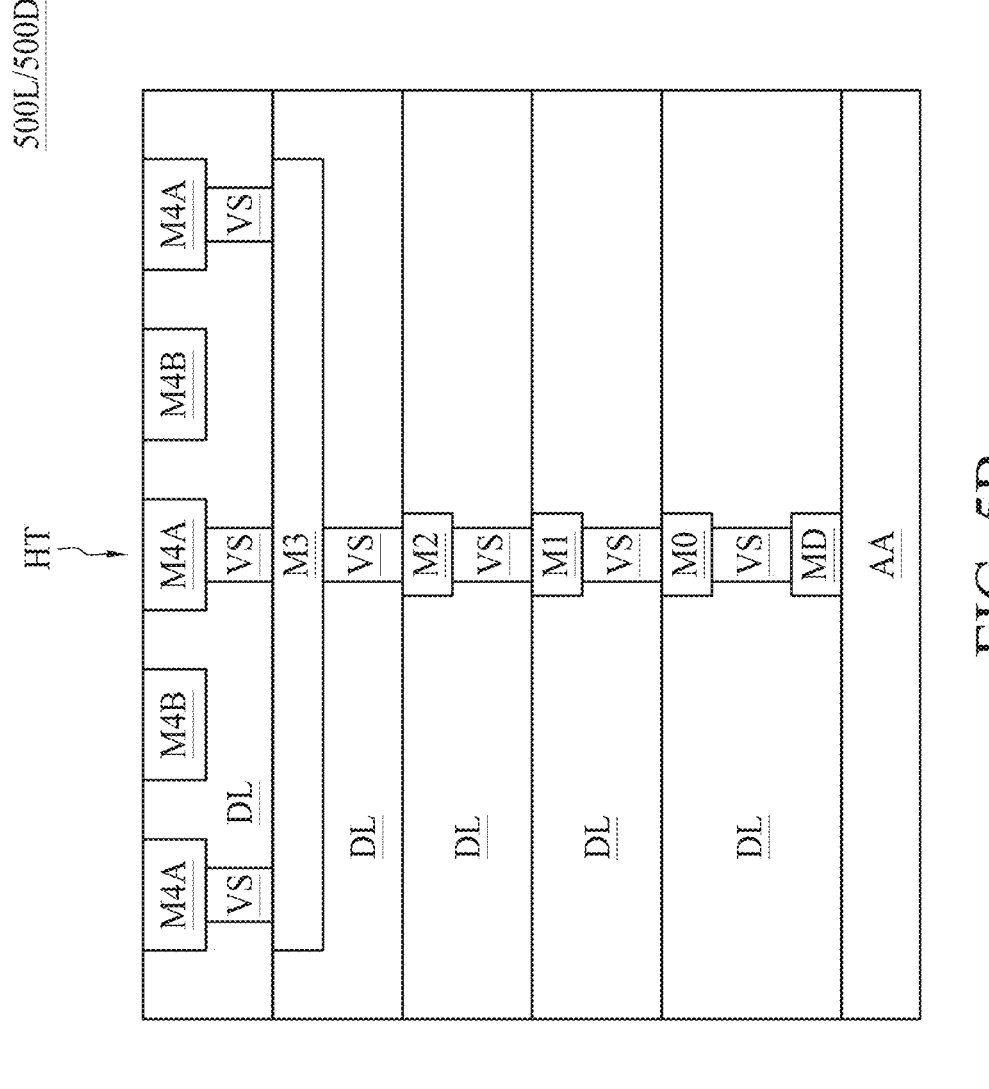
Figure 5C:
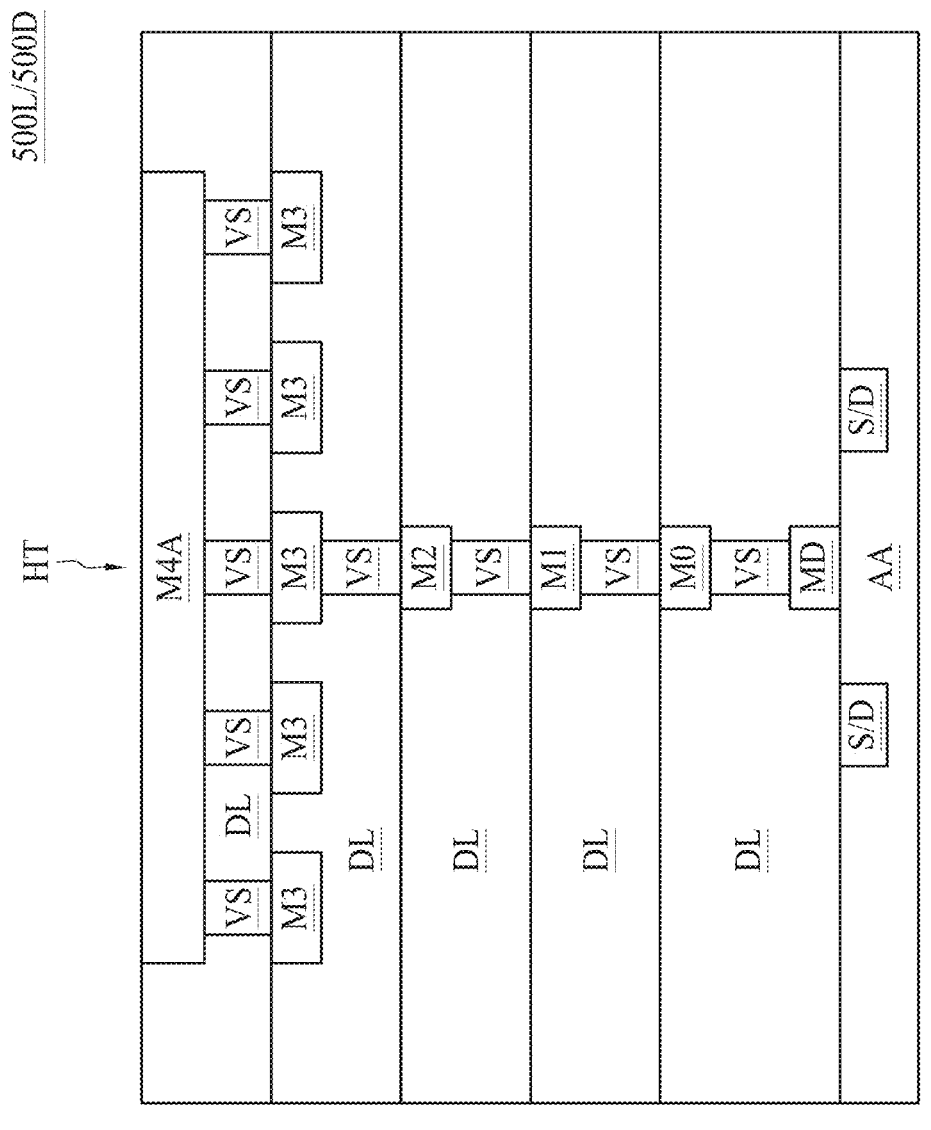

FIGS. 5A-5C are diagrams of IC layout diagram 500L and corresponding IC device 500D, in accordance with some embodiments. FIG. 5A is a plan view including the X and Y directions, FIG. 5B is a cross-sectional view including the Y and Z directions, and FIG. 5C is a cross-sectional view including the X and Z directions.

As depicted in FIG. 5A, layout diagram/device 500L/500D includes metal regions/segments X1-X10 extending in the X direction in metal layer MX, metal regions/segments Y1-Y5 extending in the Y direction in metal layer MY, metal regions/segments B1-B4 extending in the Y direction in the one or more other metal layers, and instances of via region/structure VS, the various features corresponding to those discussed above with respect to FIGS. 1A-3B.

Each of metal regions/segments X2 and X4 intersects metal region/segment B3, each of metal regions/segments X4 and X6 intersects metal region/segment B1, each of metal regions/segments X6 and X8 intersects metal region/segment B4, and each of metal regions/segments X8 and X10 intersects metal region/segment B2. Instances of via region/structure VS are positioned at each of the corresponding intersections and are configured to electrically connect the corresponding ones of metal regions/segments X2, X4, X6, X8, and X10 to the corresponding ones of metal regions/segments B1-B4. IC layout diagram/device 500L/500D thereby includes a series of metal regions/segments X2, B3, X4, B1, X6, B4, X8, B2, and X10 electrically connected through instances of via region/structure VS configured as resistor R3 (labeled at each end of the series).

Each of metal regions/segments X1, X3, X5, X7, and X9 intersects each of metal regions/segments Y1-Y5. Instances of via region/structure VS are positioned at each of the corresponding intersections and are configured to electrically connect the corresponding ones of metal regions/segments X1, X3, X5, X7, and X9 to the corresponding ones of metal regions/segments Y1-Y5. IC layout diagram/device 500L/500D thereby includes a plurality of metal regions/segments X1, X3, X5, X7, X9, and Y1-Y5 electrically and thermally connected through instances of via region/structure VS configured as a heat transfer structure HT.

In addition to the intersections discussed above, each of metal regions/segments X2, X4, X6, and X8 crosses each of metal regions/segments Y1-Y5, metal region/segment X3 crosses metal region/segment B3, metal region/segment X5 crosses metal region/segment B1, metal region/segment X7 crosses metal region/segment B4, and metal region/segment X9 crosses metal region/segment B2, each crossing location being free from including an instance of via region/structure VS. IC layout diagram/device 500L/500D thereby includes resistor R3 and heat transfer structure HT configured to be electrically isolated from each other. Based on the proximity of the adjacent metal regions/segments X1-X10 and Y1-Y5, resistor R3 and heat transfer structure HT are configured to be thermally coupled to each other such that resistor R3 and heat transfer structure HT can reasonably be assumed to have a same temperature in operation.

FIG. 5B depicts one of metal regions/segments Y1-Y5 represented as an instance of metal region/segment M3 positioned in metal layer MY being the third metal layer and five of metal regions/segments X1-X10 represented as instances of metal regions/segments M4A and M4B positioned in metal layer MX being the fourth metal layer. Each instance of metal region/segment M4A corresponds to an odd-numbered one of metal regions/segments X1-X10 of heat transfer structure HT electrically and thermally connected to metal region/segment M3 by an instance of via region/structure VS positioned between metal region/segment M3 and the corresponding instance of metal region/segment M4A. Each instance of metal region/segment M4B corresponds to an even-numbered one of metal regions/segments X1-X10 included in resistor R3 and electrically isolated from heat transfer structure HT.

FIG. 5C depicts a single one of the odd-numbered metal regions/segments X1-X10 of heat transfer structure HT represented as an instance of metal region/segment M4A electrically and thermally connected by instances of via region/structure VS to metal regions/segments Y1-Y5 represented as instances of metal region/segment M3.

As depicted in FIGS. 5B and 5C, heat transfer structure HT also includes metal regions/segments M0 through M2, conductive region/segment MD, and the corresponding instances of via region/structure VS positioned in corresponding instances of dielectric layer DL and configured as an electrically and thermally conductive path to active region/area AA including instances of source/drain region/structure S/D, as discussed above with respect to FIGS. 3A and 3B. Heat transfer structure HT is thereby configured to include each of metal regions/segments M3 and M4A having a temperature representative of that of one or more active devices including active region/area AA and source/drain regions/structures S/D.

Because IC layout diagram/device 500L/500D is configured such that resistor R3 and heat transfer structure HT have the same temperature, IC layout diagram/device 500L/500D is configured to include resistor R3 having the temperature representative of that of the one or more active devices, in operation. IC device 500D based on IC layout diagram 500L is thereby capable of being used in temperature measurements, e.g., a method 800 discussed below with respect to FIG. 8, in which TCR variations are reduced compared to approaches in which thermal sensors include underlying structure elements, e.g., bipolar junction transistors (BJTs), without thermally conductive paths to overlying structures.

The embodiment depicted in FIGS. 5A-5C is a non-limiting example provided for the purpose of illustration. Other configurations of IC layout diagram/device 500L/500D including resistor R3 and heat transfer structure HT configured in accordance with the arrangement depicted in FIGS. 5A-5C, e.g., including variations in the numbers of metal regions/segments included in and/or crossed within one or both of resistor R3 or heat transfer structure HT, are within the scope of the present disclosure.

As depicted in FIGS. 5A-5C, metal regions/segments X1-X10 and Y1-Y5 do not include variations in widths and/or spacing. In some embodiments, metal regions/segments X1-X10 and Y1-Y5 include variations in widths and/or spacing. In some embodiments, metal regions/segments X1-X10 and Y1-Y5 include variations in widths and/or spacing corresponding to a multiple patterning manufacturing process, e.g., a double-patterning process such as a SALE2 process.

In some embodiments, the odd-numbered ones of metal regions/segments X1-X10 of heat transfer structure HT correspond to a first pattern of a multiple patterning process, and the even-numbered ones of metal regions/segments X1-X10 of resistor R3 correspond to a second pattern of the multiple patterning process.

In some embodiments, alternating ones of metal regions/segments Y1-Y5 of heat transfer structure HT correspond to first and second patterns of a multiple patterning process, as discussed below with respect to FIGS. 6A and 6B.

Figure 6A:
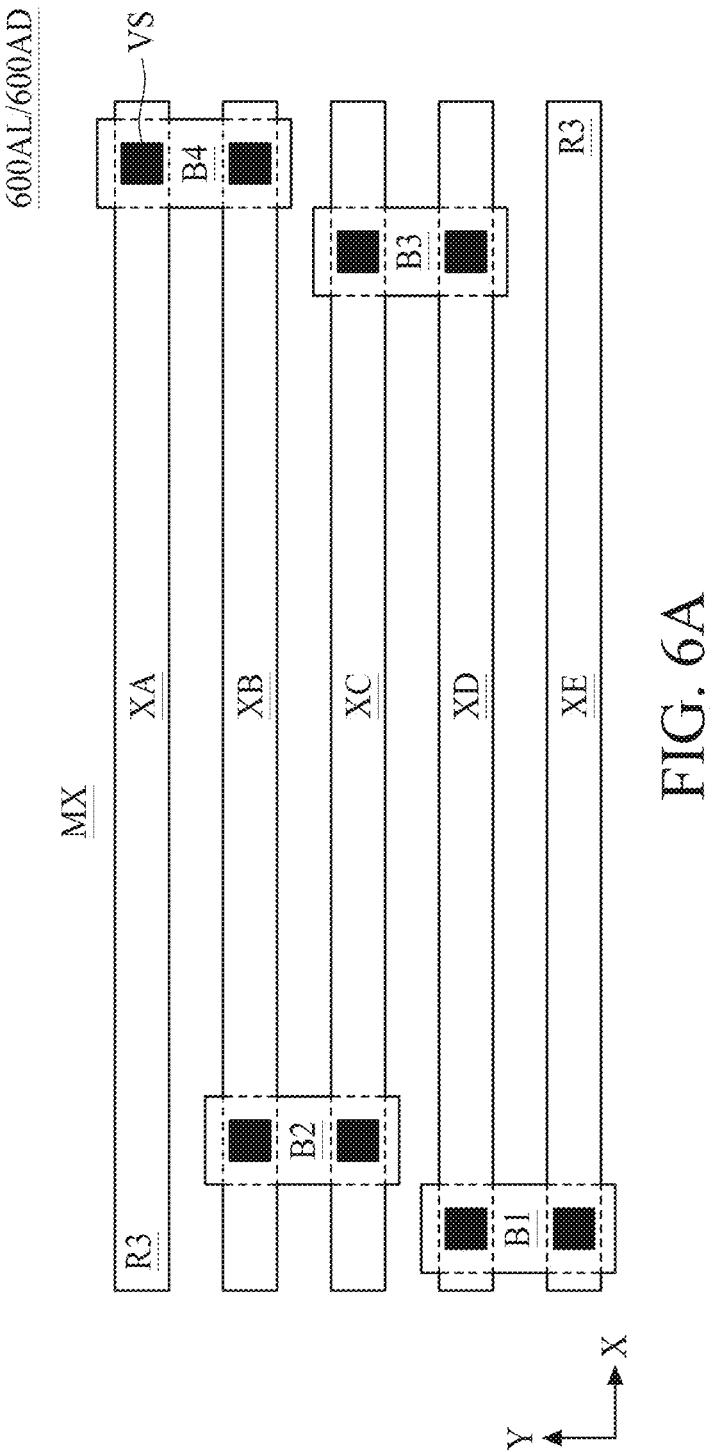
FIGS. 6A and 6B are diagrams of IC layout diagrams and corresponding IC devices, in accordance with some embodiments.

FIG. 6A is a diagram of IC layout diagram 600AL and corresponding IC device 600AD, in accordance with some embodiments. In the embodiment depicted in FIG. 6A, IC layout diagram/device 600AL/600AD includes resistor R3, discussed above with respect to FIGS. 5A-5C, including metal regions/segments XA-XE extending in the X direction in metal layer MX, metal regions/segments B1-B4 extending in the Y direction in the one or more other metal layers, and instances of via region/structure VS at corresponding intersections of metal regions/segments XA-XE and metal regions/segments B1-B4.

In some embodiments, metal regions/segments XA-XE correspond to the even-numbered ones of metal regions/segments X1-X10, each of metal regions/segments XA-XE being separated from adjacent one(s) of metal regions/segments XA-XE by a single one of the odd-numbered ones of metal regions/segments X1-X10 included in heat transfer structure HT. In some embodiments, metal regions/segments XA-XE otherwise correspond to a first subset of metal regions/segments X1-X10, a given one of the first subset being separated from adjacent one(s) of metal regions/segments XA-XE by more than one of a second subset of metal regions/segments X1-X10 included in heat transfer structure HT. In some embodiments, metal regions/segments XA-XE are adjacent to each other and IC layout diagram/device 600AL/600AD includes resistor R3 free from being thermally coupled to heat transfer structure HT.

In some embodiments, each of metal regions/segments XA-XE corresponds to a same pattern of a multiple patterning process, e.g., a first pattern or a second pattern. In some embodiments, alternating ones of metal regions/segments XA-XE correspond to alternating patterns of a multiple patterning process, e.g., first and second patterns.

Figure 6B:
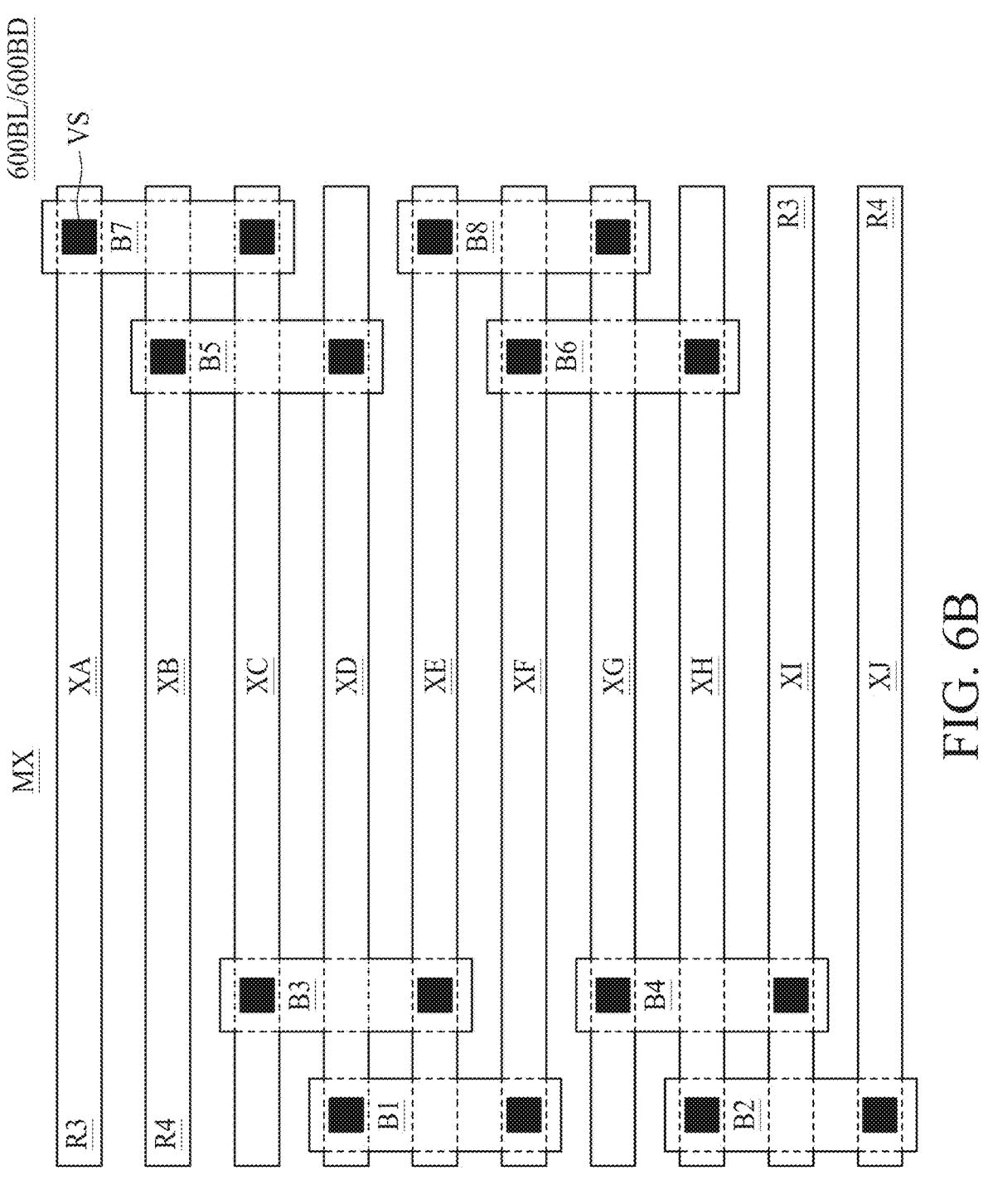

FIG. 6B is a diagram of IC layout diagram 600BL and corresponding IC device 600BD, in accordance with some embodiments. In the embodiment depicted in FIG. 6B, IC layout diagram/device 600BL/600BD includes resistor R3, including a first subset of metal regions/segments XA-XJ extending in the X direction in metal layer MX, and a resistor R4 including a second subset of metal regions/segments XA-XJ. Resistor R3 also includes metal regions/segments B3, B4, B7, and B8 extending in the Y direction in the one or more other metal layers and instances of via region/structure VS at corresponding intersections of the first subset of metal regions/segments XA-XJ and metal regions/segments B3, B4, B7, and B8. Resistor R4 also includes metal regions/segments B1, B2, B5, and B6 extending in the Y direction in the one or more other metal layers and instances of via region/structure VS at corresponding intersections of the second subset of metal regions/segments XA-XJ and metal regions/segments B1, B2, B5, and B6.

In some embodiments, metal regions/segments XA-XJ correspond to the even-numbered ones of metal regions/segments X1-X10, each of metal regions/segments XA-XJ being separated from adjacent one(s) of metal regions/segments XA-XJ by a single one of the odd-numbered ones of metal regions/segments X1-X10 included in heat transfer structure HT. In some embodiments, metal regions/segments XA-XJ otherwise correspond to first and second subsets of metal regions/segments X1-X10, a given one of the first or second subset being separated from adjacent one(s) of metal regions/segments XA-XJ by more than one of a third subset of subset of regions/segments X1-X10 included in heat transfer structure HT. In some embodiments, metal regions/segments XA-XJ are adjacent to each other and IC layout diagram/device 600BL/600BD includes resistors R3 and R4 free from being thermally coupled to heat transfer structure HT.

In some embodiments, each of the first subset of metal regions/segments XA-XJ corresponds to a same first pattern of a multiple patterning process and each of the second subset of metal regions/segments XA-XJ corresponds to a same second pattern of the multiple patterning process. In some embodiments, one or both of the first or second subsets of metal regions/segments XA-XJ corresponds to more than one pattern of a multiple patterning process.

The embodiments depicted in FIGS. 6A and 6B are non-limiting examples provided for the purpose of illustration. Other configurations of IC layout diagrams/devices 600AL/600AD and 600BL/600BD including one or more of resistors R3, R4, or heat transfer structure HT configured in accordance with the arrangements depicted in FIGS. 6A and 6B, e.g., including variations in the numbers of metal regions/segments included in and/or crossed within one or more of resistors R3, R4, or heat transfer structure HT, are within the scope of the present disclosure.

IC device 600AD or 600BD based on corresponding IC layout 600AL or 600BL is thereby configured to include a resistor or resistor pair including metal segments corresponding to one or more patterns of a multiple patterning process, e.g., a SALE2 process. IC device 600AD or 600BD is thereby capable of being used in temperature measurements, e.g., method 800 discussed below with respect to FIG. 8, in which TCR variations corresponding to the one or more patterns are included in difference and/or averaging techniques, thereby reducing the effect of TCR variations on temperature measurements compared to approaches that are not based on metal segments corresponding to one or more patterns of a multiple patterning process.

In some embodiments, IC device 600AD or 600BD including heat transfer structure HT based on corresponding IC layout 600AL or 600BL is further capable of being used in temperature measurements representative of those of one or more underlying active devices as discussed above with respect to FIGS. 5A-5C.

Figure 7:
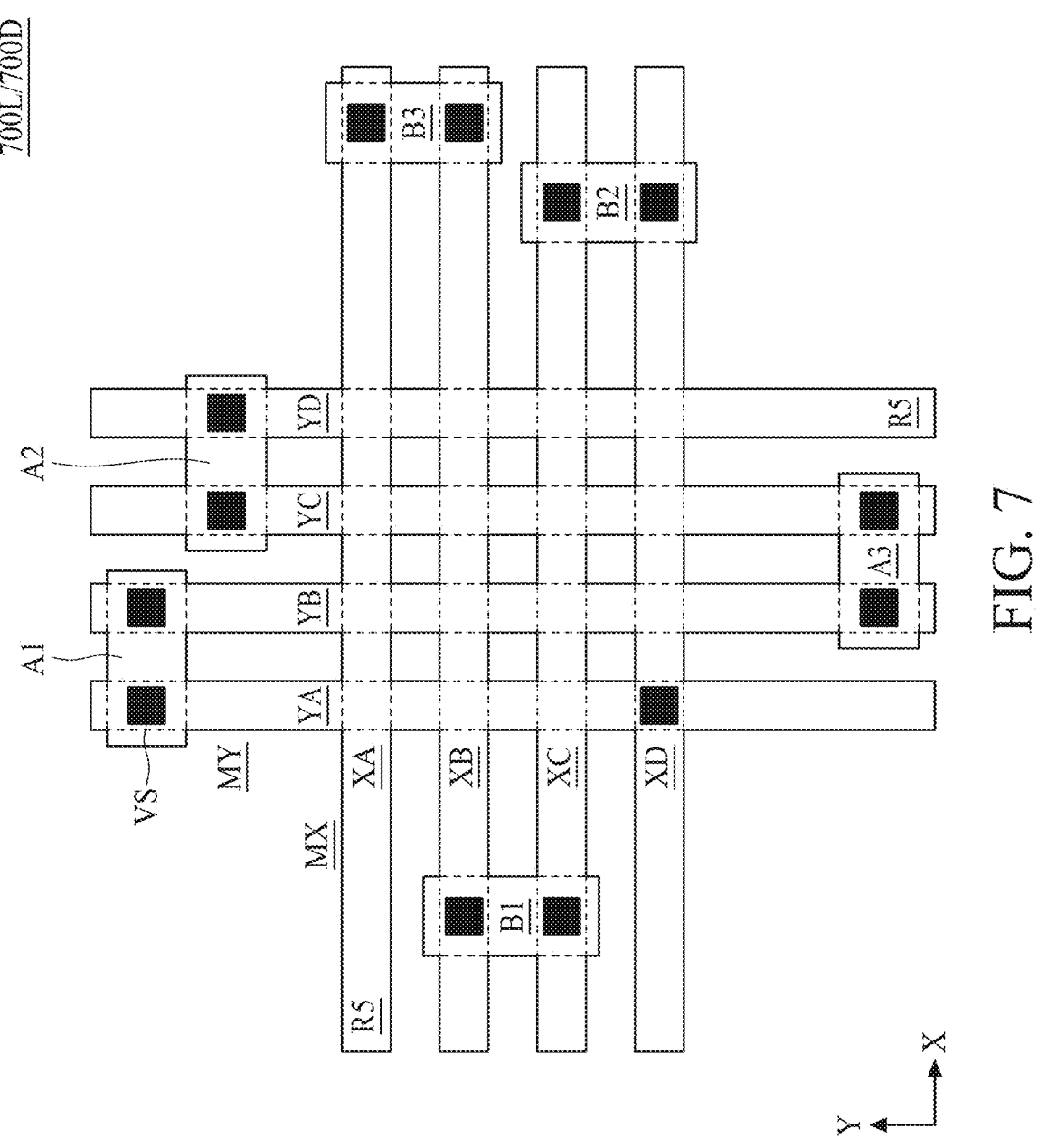
FIG. 7 is a diagram of an IC layout diagram and corresponding IC device, in accordance with some embodiments.

In the embodiment depicted in FIG. 7, IC layout diagram/device 700L/700D includes metal regions/segments XA-XD extending in the X direction in metal layer MX, metal regions/segments A1-A3 extending in the X direction in the one or more other metal layers, metal regions/segments B1-B3 extending in the Y direction in the one or more other metal layers, and instances of via region/structure VS, the various features corresponding to those discussed above with respect to FIGS. 1A-6B. IC layout diagram/device 700L/700D also includes metal regions/segments YA-YD extending in the Y direction in metal layer MY and related to metal regions/segments Y1-Y5 in the manner in which metal regions/segments XA-XD are related to metal regions/segments X1-X10, as discussed above with respect to FIGS. 5A-5C.

Each of metal regions/segments XA and XB intersects metal region/segment B3, each of metal regions/segments XB and XC intersects metal region/segment B1, each of metal regions/segments XC and XD intersects metal region/segment B2, metal region/segment XD intersects metal region/segment YA, each of metal regions/segments YA and YB intersects metal region/segment A1, each of metal regions/segments YB and YC intersects metal region/segment A3, and each of metal regions/segments YC and YD intersects metal region/segment A2. The instances of via region/structure VS are positioned at each of the corresponding intersections and are configured to electrically connect the corresponding ones of metal regions/segments XA-XD to the corresponding ones of metal regions/segments YA and B1-B3 and the corresponding ones of metal regions/segments YA-YD to the corresponding ones of metal regions/segments A1-A3. In addition to the intersections discussed above, each of metal regions/segments XA-XC crosses each of metal regions/segments YA-YD and metal region/segment XD crosses each of metal regions/segments YB-YD, each crossing location being free from including an instance of via region/structure VS. IC layout diagram/device 700L/700D thereby includes a series of metal regions/segments XA, B3, XB, B1, XC, B2, XD, YA, A1, YB, A3, YC, A2, and YD electrically connected through instances of via region/structure VS configured as resistor R5 (labeled at each end of the series).

In some embodiments, each of metal regions/segments XA-XD and YA-YD corresponds to a same pattern of a multiple patterning process, e.g., a first pattern or a second pattern. In some embodiments, subsets of metal regions/segments XA-XD and YA-YD correspond to first and second patterns of a multiple patterning process as discussed above.

IC device 700D is thereby capable of being used in temperature measurements, e.g., method 800 discussed below with respect to FIG. 8, in which TCR variations are based on layers MX and MY, thereby reducing the effect of TCR variations on temperature measurements compared to approaches that are not based on metal segments corresponding to multiple layers. In some embodiments, IC device 7D including heat transfer structure HT based on corresponding IC layout 700L is further capable of being used in temperature measurements representative of those of one or more underlying active devices as discussed above with respect to FIGS. 5A-5C.

FIG. 8 is a flowchart of method 800 of operating an IC device, in accordance with some embodiments. Method 800 is usable with an IC device including at least one resistor, e.g., an IC device 100AD-200BD including resistor pair R1/R2 discussed above with respect to FIGS. 1A-4 or an IC device 500D-700D including at least one of resistors R3-R5 discussed above with respect to FIGS. 5A-7.

The sequence in which the operations of method 800 are depicted in FIG. 8 is for illustration only; the operations of method 800 are capable of being executed in sequences that differ from that depicted in FIG. 8. In some embodiments, operations in addition to those depicted in FIG. 8 are performed before, between, during, and/or after the operations depicted in FIG. 8.

In some embodiments, some or all of the operations of method 800 are a subset of a method of operating an IC, e.g., a system on a chip (SOC), including an IC device including at least one resistor.

At operation 810, a resistance measurement of at least one resistor is performed, the at least one resistor including metal segments having differing metal widths, corresponding to one or more patterns of a multiple patterning process, or being positioned in multiple metal layers. In various embodiments, performing the resistance measurement includes performing sequential or parallel measurements on the at least one resistor.

In some embodiments, performing the resistance measurement includes performing a differential resistance measurement of a resistor pair. In some embodiments, performing the differential resistance measurement of the resistor pair includes performing the differential resistance measurement of differential resistor pair R1/R2 discussed above with respect to FIGS. 1A-4 or on resistors R3 and R4 discussed above with respect to FIGS. 5A-6B.

In some embodiments, performing the resistance measurement on the at least one resistor including metal segments corresponding to one or more patterns of the multiple patterning process includes performing the resistance measurement on one or both of resistors R3 or R4 discussed above with respect to FIGS. 5A-6B. In some embodiments, performing the resistance measurement on the at least one resistor including metal segments corresponding to one or more patterns of the multiple patterning process includes calculating an average including first and second resistance measurements on first and second resistors, e.g., resistors R3 and/or R4, corresponding to the first and second patterns of the multiple patterning process.

In some embodiments, performing the resistance measurement on the at least one resistor including metal segments positioned in multiple metal layers includes performing the resistance measurement on resistor R5 discussed above with respect to FIG. 7.

At operation 820, a temperature is calculated based on the resistance measurement and at least one TCR value corresponding to the at least one resistor. In some embodiments, calculating the temperature includes calculating the second temperature T2 based on the differential resistance measurement and TCR values of each resistor of differential resistor pair R1/R2 as discussed above with respect to FIG. 4.

At operation 830, in response to the calculated temperature, an adjustment to a circuit operation is made. In various embodiments, making the adjustment to the circuit operation includes adjusting one or more operating parameters, e.g., reducing a voltage, current, or power level, or performing one or more actions, e.g., entering a reduced power mode or triggering an alert or bypass operation, to reduce or avoid an overheating condition.

By executing some or all of the operations of method 800, a resistance measurement is used to calculate a temperature using an IC device including at least one resistor, thereby obtaining the benefits discussed above with respect to IC devices 100AD-700D.

FIG. 9 is a flowchart of a method 900 of generating an IC layout diagram corresponding to an IC device, e.g., an IC layout diagram 100AL-200BL discussed above with respect to FIGS. 1A-4 or an IC layout diagram 500L-700L discussed above with respect to FIG. 5A-7.

In some embodiments, some or all of method 900 is executed by a processor of a computer, e.g., a processor 1102 of an IC design system 1100, discussed below with respect to FIG. 11.

Some or all of the operations of method 900 are capable of being performed as part of a design procedure performed in a design house, e.g., a design house 1220 discussed below with respect to FIG. 12.

In some embodiments, the operations of method 900 are performed in the order depicted in FIG. 9. In some embodiments, the operations of method 900 are performed simultaneously and/or in an order other than the order depicted in FIG. 9. In some embodiments, one or more operations are performed before, between, during, and/or after performing one or more operations of method 900.

At operation 910, in some embodiments, a thermally conductive path is defined at an active region in an IC layout diagram. In some embodiments, defining the thermally conductive path includes defining the thermally conductive path including one or more features of a transistor corresponding to the active region. In some embodiments, defining the thermally conductive path includes defining one of the thermally conductive paths discussed above with respect to FIGS. 3A, 3B, 5B, and/or 5C.

At operation 920, first and second metal regions are defined in a first metal layer, the first and second metal regions being electrically isolated from each other. In some embodiments, defining the first metal region includes defining multiple first metal regions in the first metal layer and/or defining the second metal region includes defining multiple second metal regions in the first metal layer, each of the multiple first metal regions being electrically isolated from each of the multiple second metal regions.

In some embodiments, defining the first and second metal regions in the first metal layer includes defining the first and second metal regions having differing metal widths. In some embodiments, defining the first and second metal regions in the first metal layer includes defining the second width greater than the first width. In some embodiments, defining the first and second metal regions in the first metal layer includes defining two or more of metal regions Y1-Y12 in metal layer MY, the first metal region having width W1 and the second metal region having width W2, as discussed above with respect to FIGS. 1A-4.

In some embodiments, defining the first and second metal regions in the first metal layer includes defining one or more of metal regions B1-B5 discussed above with respect to FIGS. 2A and 2B.

In some embodiments, defining the first and second metal regions in the first metal layer includes defining the first metal region included in heat transfer structure HT and the second metal region included in one of resistors R3-R5, each discussed above with respect to FIGS. 5A-7.

At operation 930, third and fourth metal regions are defined in at least one second metal layer, the third metal region defining an electrical connection to the first metal region, and the fourth metal region defining an electrical connection to the second metal region. In various embodiments, defining the third and fourth metal regions in the at least one second metal layer includes defining the third and fourth metal region in a same second metal layer or in different second metal layers.

In some embodiments, defining the third and fourth metal regions in the at least one second metal layer includes defining two or more of metal regions A1-A5 discussed above with respect to FIGS. 1A-3B. In some embodiments, defining the third and fourth metal regions in the at least one second metal layer includes defining two or more of metal regions X1-X9 discussed above with respect to FIGS. 2A-3B.

In some embodiments, defining the third and fourth metal regions in the at least one second metal layer includes defining two or more of metal regions Y1-Y5 or B1-B8 discussed above with respect to FIGS. 5A-6B. In some embodiments, defining the third and fourth metal regions in the at least one second metal layer includes defining two or more of metal regions YA-YD or B1-B4 discussed above with respect to FIG. 7.

In some embodiments, defining the third and fourth metal regions in the at least one second metal layer includes defining two or more instances of via region VS discussed above with respect to FIGS. 1A-7.

In some embodiments, each of defining the first metal region in operation 920 and defining the third metal region in operation 930 is part of defining resistor R1, and defining the second metal region in operation 920 and defining the fourth metal region in operation 930 is part of defining resistor R2, each discussed above with respect to FIGS. 1A-4.

In some embodiments, defining the third and fourth metal regions in the at least one second metal layer includes defining electrical connections to one or more circuits configured to perform one or more resistance measurements as discussed above with respect to FIGS. 4 and 8.

At operation 940, in some embodiments, the IC layout diagram is stored in a storage device. In various embodiments, storing the IC layout diagram in the storage device includes storing the IC layout diagram in a non-volatile, computer-readable memory or a cell library, e.g., a database, and/or includes storing the IC layout diagram over a network. In some embodiments, storing the IC layout diagram in the storage device includes storing the IC layout diagram in IC design storage 1107 or over network 1114 of IC design system 1100, discussed below with respect to FIG. 11.

At operation 950, in some embodiments, at least one of one or more semiconductor masks, or at least one component in a layer of a semiconductor IC is fabricated based on the IC layout diagram. Fabricating one or more semiconductor masks or at least one component in a layer of a semiconductor IC is discussed below with respect to FIG. 12.

At operation 960, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed below with respect to FIGS. 10 and 12.

By executing some or all of the operations of method 900, an IC layout diagram is generated corresponding to an IC device including at least one resistor in accordance with the embodiments discussed above, thereby obtaining the benefits discussed above with respect to IC devices 100AD-200BD and 500D-700D.

FIG. 10 is a flowchart of a method 1000 of manufacturing an IC device, in accordance with some embodiments. Method 1000 is operable to form an IC device 100AD-200BD discussed above with respect to FIGS. 1A-4 or 500D-700D discussed above with respect to FIGS. 5A-7.

In some embodiments, the operations of method 1000 are performed in the order depicted in FIG. 10. In some embodiments, the operations of method 1000 are performed in an order other than the order of FIG. 10. In some embodiments, one or more additional operations are performed before, during, between, and/or after the operations of method 1000.

In some embodiments, one or more operations of method 1000 are a subset of operations of a method of forming an IC device, e.g., an SOC. In some embodiments, performing some or all of the operations of method 1000 includes performing one or more operations as discussed below with respect to IC manufacturing system 1200 and FIG. 12.

At operation 1010, in some embodiments, a thermally conductive path is constructed on a semiconductor substrate. In some embodiments, constructing the thermally conductive path includes constructing the thermally conductive path on an active area of the semiconductor substrate. In some embodiments, constructing the thermally conductive path includes constructing the thermally conductive path including one or more transistor features of the active area.

Constructing one or more transistor features includes performing a plurality of manufacturing operations, e.g., one or more of a lithography, diffusion, deposition, etching, planarizing, or other operation suitable for building a gate structure adjacent and/or a source or drain (S/D) structure overlying or positioned in the active area of the semiconductor substrate.

Constructing the thermally conductive path includes constructing electrical connections, e.g., via structures and/or contacts, e.g., to the gate structure and/or S/D structure. In various embodiments, constructing the thermally conductive path includes constructing elements of a planar transistor, a FinFET, a GAA transistor, or other IC device suitable for providing a thermal conduction path between overlying metal features and the semiconductor substrate.

In some embodiments, constructing the thermally conductive path includes constructing one of the thermally conductive paths discussed above with respect to FIGS. 3A, 3B, 5B, and 5C.

At operation 1020, first and second metal segments are formed in a first metal layer, the first and second metal segments being electrically isolated from each other.

Forming a metal segment, e.g., the first and second metal segments or a via structure such as via structure VS discussed above with respect to FIGS. 1A-7, includes performing one or more conformal deposition processes, e.g., an atomic layer deposition (ALD) or chemical vapor deposition (CVD) process, followed by one or more etching processes, by which one or more conductive materials are formed on and/or in a layer including one or more dielectric materials. In various embodiments, the one or more conductive materials include one or more of Cu, Ag, W, Ti, Ni, Sn, Al or another metal or suitable material, e.g., polysilicon. In various embodiments, the one or more dielectric materials include SiN, SiON, SiO$_2$, SiC, SiOC, or another suitable material.

In some embodiments, forming the first and second metal segments includes forming the first and second metal segments having differing widths. In some embodiments, forming the first and second metal segments includes forming two or more of metal segments Y1-Y12 in metal layer MY, the first metal segment having width W1 and the second metal segment having width W2, as discussed above with respect to FIGS. 1A-4.

In some embodiments, forming the first and second metal segments in the first metal layer includes forming one or more of metal segments B1-B5 discussed above with respect to FIGS. 2A and 2B.

In some embodiments, forming the first and second metal segments includes forming one or more dummy metal segments Y1-Y12 as discussed above with respect to FIGS. 1A-4.

In some embodiments, forming the first and second metal segments in the first metal layer includes forming the first metal segment included in heat transfer structure HT and the second metal segment included in one of resistors R3-R5, each discussed above with respect to FIGS. 5A-7.

At operation 1030, third and fourth metal segments are formed in at least one second metal layer, the third metal segment being part of an electrical connection to the first metal segment, and the fourth metal segment being part of an electrical connection to the second metal segment. In various embodiments, forming the third and fourth metal segments in the one or more second metal layer includes forming the third and fourth metal segments in a same second metal layer or in different second metal layers.

In some embodiments, forming the third and fourth metal segments in the one or more second metal layer includes forming two or more of metal segments A1-A5 discussed above with respect to FIGS. 1A-3. In some embodiments, forming the third and fourth metal segments in the one or more second metal layer includes forming two or more of metal segments X1-X9 discussed above with respect to FIGS. 2A-3B.

In some embodiments, forming the third and fourth metal segments in the at least one second metal layer includes forming two or more of metal segments Y1-Y5 or B1-B8 discussed above with respect to FIGS. 5A-6B. In some embodiments, forming the third and fourth metal segments in the at least one second metal layer includes forming two or more of metal segments YA-YD or B1-B4 discussed above with respect to FIG. 7.

In some embodiments, forming the third and fourth metal segments in the one or more second metal layer includes forming two or more instances of via structure VS discussed above with respect to FIGS. 1A-7.

In some embodiments, each of forming the first metal segment in operation 1020 and forming the third metal segment in operation 1030 is part of forming resistor R1, and forming the second metal segment in operation 1020 and forming the fourth metal segment in operation 1030 is part of forming resistor R2, each discussed above with respect to FIGS. 1A-4.

In some embodiments, forming the third and fourth metal segments includes forming one or more dummy metal segments X1-X9 as discussed above with respect to FIGS. 2A-3B.

At operation 1040, in some embodiments, electrical connections are formed between at least one of the first or second metal segments and one or more measurement circuits. Forming the one or more electrical connections includes forming one or more metal segments as discussed above.

By performing some or all of the operations of method 1000, an IC device is manufactured including at least one resistor in accordance with the embodiments discussed above, thereby obtaining the benefits discussed above with respect to IC devices 100AD-200BD and 500D-700D.

Figure 11:
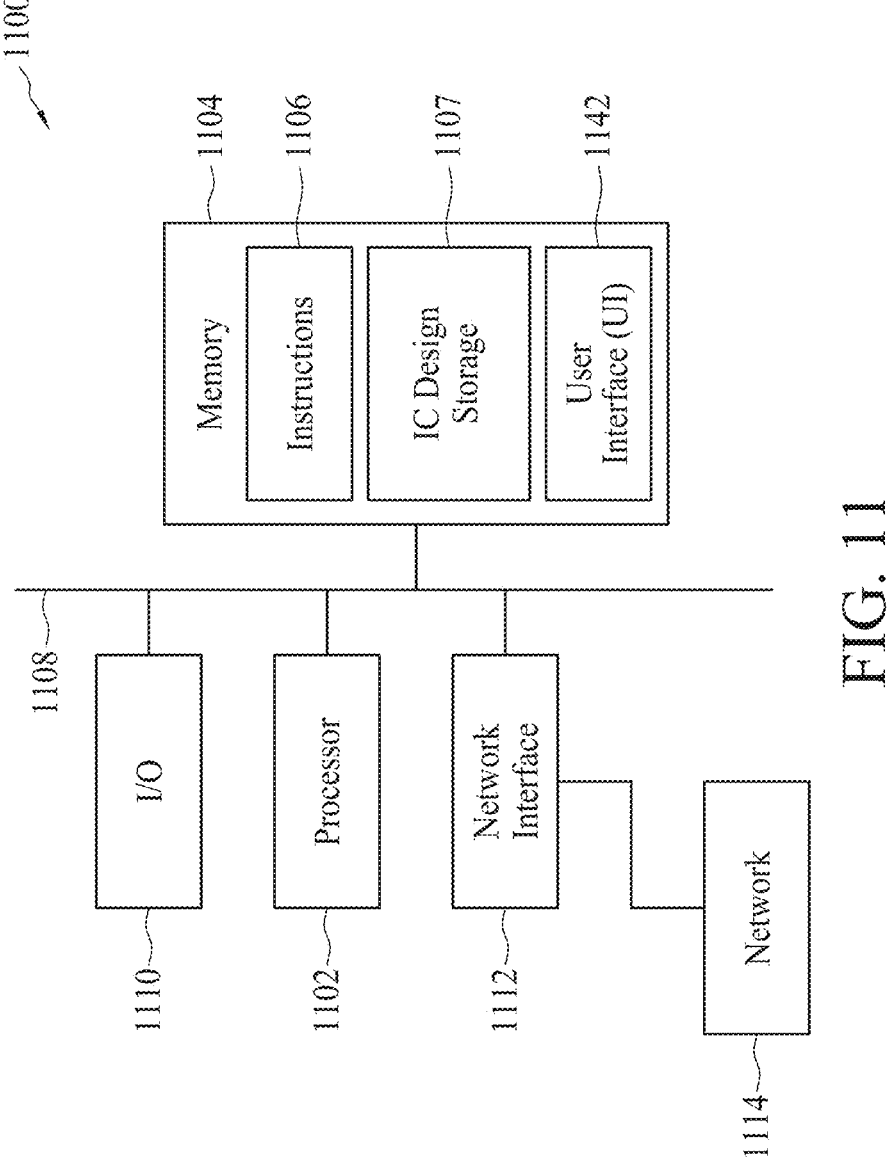
FIG. 11 is a block diagram of an IC layout diagram generation system, in accordance with some embodiments.

FIG. 11 is a block diagram of IC design system 1100, in accordance with some embodiments. Methods described herein of designing IC layout diagrams in accordance with one or more embodiments are implementable, for example, using IC design system 1100, in accordance with some embodiments.

In some embodiments, IC design system 1100 is a general purpose computing device including a hardware processor 1102 and non-transitory, computer-readable storage medium 1104. Storage medium 1104, amongst other things, is encoded with, i.e., stores, computer program code 1106, i.e., a set of executable instructions. Execution of instructions 1106 by hardware processor 1102 represents (at least in part) an EDA tool which implements a portion or all of a method, e.g., method 900 of generating an IC layout diagram described above (hereinafter, the noted processes and/or methods).

Processor 1102 is electrically coupled to computer-readable storage medium 1104 via a bus 1108. Processor 1102 is also electrically coupled to an I/O interface 1110 by bus 1108. Network interface 1112 is also electrically connected to processor 1102 via bus 1108. Network interface 1112 is connected to a network 1114, so that processor 1102 and computer-readable storage medium 1104 are capable of connecting to external elements via network 1114. Processor 1102 is configured to execute computer program code 1106 encoded in computer-readable storage medium 1104 in order to cause IC design system 1100 to be usable for performing a portion or all of the noted processes and/or methods. In one or more embodiments, processor 1102 is a central processing unit (CPU), a multi-processor, a distributed processing system, an application specific integrated circuit (ASIC), and/or a suitable processing unit.

In one or more embodiments, computer-readable storage medium 1104 is an electronic, magnetic, optical, electromagnetic, infrared, and/or a semiconductor system (or apparatus or device). For example, computer-readable storage medium 1104 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1104 includes a compact disk-read only memory (CD-ROM), a compact disk-read/write (CD-R/W), and/or a digital video disc (DVD).

In one or more embodiments, storage medium 1104 stores computer program code 1106 configured to cause IC design system 1100 (where such execution represents (at least in part) the EDA tool) to be usable for performing a portion or all of the noted processes and/or methods. In one or more embodiments, storage medium 1104 also stores information which facilitates performing a portion or all of the noted processes and/or methods. In one or more embodiments, storage medium 1104 includes IC design storage 1107 configured to store one or more IC layout diagrams, e.g., an IC layout diagram 100AL-200BL discussed above with respect to FIGS. 1A-4.

IC design system 1100 includes I/O interface 1110. I/O interface 1110 is coupled to external circuitry. In one or more embodiments, I/O interface 1110 includes a keyboard, keypad, mouse, trackball, trackpad, touchscreen, and/or cursor direction keys for communicating information and commands to processor 1102.

IC design system 1100 also includes network interface 1112 coupled to processor 1102. Network interface 1112 allows IC design system 1100 to communicate with network 1114, to which one or more other computer systems are connected. Network interface 1112 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more IC design systems 1100.

IC design system 1100 is configured to receive information through I/O interface 1110. The information received through I/O interface 1110 includes one or more of instructions, data, design rules, libraries of standard cells, and/or other parameters for processing by processor 1102. The information is transferred to processor 1102 via bus 1108. IC design system 1100 is configured to receive information related to a UI through I/O interface 1110. The information is stored in computer-readable medium 1104 as user interface (UI) 1142.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by IC design system 1100. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 12:
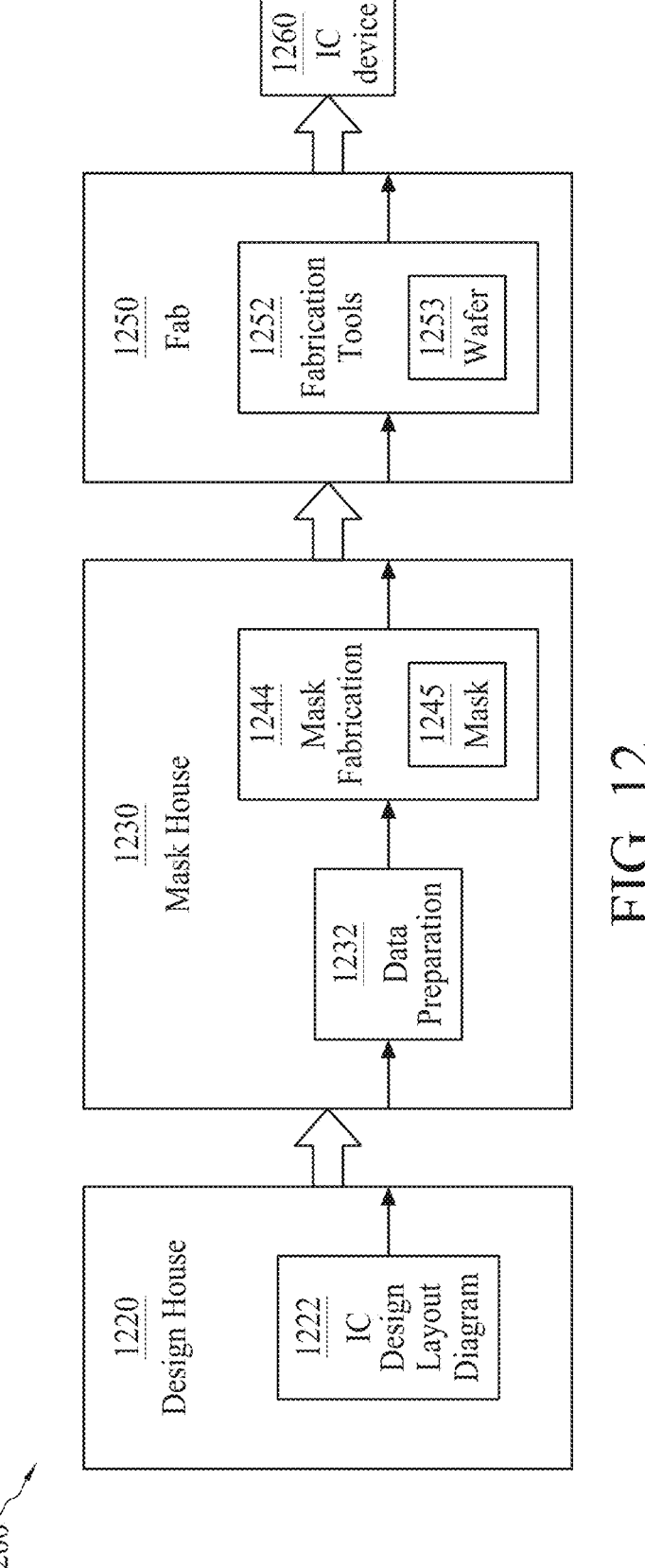
FIG. 12 is a block diagram of an IC manufacturing system, and an IC manufacturing flow associated therewith, in accordance with some embodiments.

FIG. 12 is a block diagram of IC manufacturing system 1200, and an IC manufacturing flow associated therewith, in accordance with some embodiments. In some embodiments, based on an IC layout diagram, at least one of (A) one or more semiconductor masks or (B) at least one component in a layer of a semiconductor integrated circuit is fabricated using manufacturing system 1200.

In FIG. 12, IC manufacturing system 1200 includes entities, such as a design house 1220, a mask house 1230, and an IC manufacturer/fabricator ("fab") 1250, that interact with one another in the design, development, and manufacturing cycles and/or services related to manufacturing an IC device 1260, e.g., an IC device 100AD-200BD or 500D-700D discussed above with respect to FIGS. 1A-7. The entities in system 1200 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1220, mask house 1230, and IC fab 1250 is owned by a single larger company. In some embodiments, two or more of design house 1220, mask house 1230, and IC fab 1250 coexist in a common facility and use common resources.

Design house (or design team) 1220 generates an IC design layout diagram 1222. IC design layout diagram 1222 includes various geometrical patterns, e.g., an IC layout diagram 100AL-200BL or 500L-700L discussed above with respect to FIGS. 1A-7. The geometrical patterns correspond to patterns of metal, oxide, or semiconductor layers that make up the various components of IC device 1260 to be fabricated. The various layers combine to form various IC features. For example, a portion of IC design layout diagram 1222 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1220 implements a proper design procedure to form IC design layout diagram 1222. The design procedure includes one or more of logic design, physical design or place and route. IC design layout diagram 1222 is presented in one or more data files having information of the geometrical patterns. For example, IC design layout diagram 1222 can be expressed in a GDSII file format or DFII file format.

Mask house 1230 includes data preparation 1232 and mask fabrication 1244. Mask house 1230 uses IC design layout diagram 1222 to manufacture one or more masks 1245 to be used for fabricating the various layers of IC device 1260 according to IC design layout diagram 1222. Mask house 1230 performs mask data preparation 1232, where IC design layout diagram 1222 is translated into a representative data file (RDF). Mask data preparation 1232 provides the RDF to mask fabrication 1244. Mask fabrication 1244 includes a mask writer. A mask writer converts the RDF to an image on a substrate, such as mask (reticle) 1245 or a semiconductor wafer 1253. The design layout diagram 1222 is manipulated by mask data preparation 1232 to comply with particular characteristics of the mask writer and/or requirements of IC fab 1250. In FIG. 12, mask data preparation 1232 and mask fabrication 1244 are illustrated as separate elements. In some embodiments, mask data preparation 1232 and mask fabrication 1244 can be collectively referred to as mask data preparation.

In some embodiments, mask data preparation 1232 includes optical proximity correction (OPC) which uses lithography enhancement techniques to compensate for image errors, such as those that can arise from diffraction, interference, other process effects and the like. OPC adjusts IC design layout diagram 1222. In some embodiments, mask data preparation 1232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1232 includes a mask rule checker (MRC) that checks the IC design layout diagram 1222 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1222 to compensate for limitations during mask fabrication 1244, which may undo part of the modifications performed by OPC in order to meet mask creation rules.

In some embodiments, mask data preparation 1232 includes lithography process checking (LPC) that simulates processing that will be implemented by IC fab 1250 to fabricate IC device 1260. LPC simulates this processing based on IC design layout diagram 1222 to create a simulated manufactured device, such as IC device 1260. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1222.

It should be understood that the above description of mask data preparation 1232 has been simplified for the purposes of clarity. In some embodiments, data preparation 1232 includes additional features such as a logic operation (LOP) to modify the IC design layout diagram 1222 according to manufacturing rules. Additionally, the processes applied to IC design layout diagram 1222 during data preparation 1232 may be executed in a variety of different orders.

After mask data preparation 1232 and during mask fabrication 1244, a mask 1245 or a group of masks 1245 are fabricated based on the modified IC design layout diagram 1222. In some embodiments, mask fabrication 1244 includes performing one or more lithographic exposures based on IC design layout diagram 1222. In some embodiments, an electron-beam (e-beam) or a mechanism of multiple e-beams is used to form a pattern on a mask (photomask or reticle) 1245 based on the modified IC design layout diagram 1222. Mask 1245 can be formed in various technologies. In some embodiments, mask 1245 is formed using binary technology. In some embodiments, a mask pattern includes opaque regions and transparent regions. A radiation beam, such as an ultraviolet (UV) or EUV beam, used to expose the image sensitive material layer (e.g., photoresist) which has been coated on a wafer, is blocked by the opaque region and transmits through the transparent regions. In one example, a binary mask version of mask 1245 includes a transparent substrate (e.g., fused quartz) and an opaque material (e.g., chromium) coated in the opaque regions of the binary mask. In another example, mask 1245 is formed using a phase shift technology. In a phase shift mask (PSM) version of mask 1245, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1244 is used in a variety of processes. For example, such a mask(s) is used in an ion implantation process to form various doped regions in semiconductor wafer 1253, in an etching process to form various etching regions in semiconductor wafer 1253, and/or in other suitable processes.

IC fab 1250 is an IC fabrication business that includes one or more manufacturing facilities for the fabrication of a variety of different IC products. In some embodiments, IC Fab 1250 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1250 includes wafer fabrication tools 1252 configured to execute various manufacturing operations on semiconductor wafer 1253 such that IC device 1260 is fabricated in accordance with the mask(s), e.g., mask 1245. In various embodiments, fabrication tools 1252 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1250 uses mask(s) 1245 fabricated by mask house 1230 to fabricate IC device 1260. Thus, IC fab 1250 at least indirectly uses IC design layout diagram 1222 to fabricate IC device 1260. In some embodiments, semiconductor wafer 1253 is fabricated by IC fab 1250 using mask(s) 1245 to form IC device 1260. In some embodiments, the IC fabrication includes performing one or more lithographic exposures based at least indirectly on IC design layout diagram 1222. Semiconductor wafer 1253 includes a silicon substrate or other proper substrate having material layers formed thereon. Semiconductor wafer 1253 further includes one or more of various doped regions, dielectric features, multi-level interconnects, and the like (formed at subsequent manufacturing steps).

Details regarding an IC manufacturing system (e.g., system 1200 of FIG. 12), and an IC manufacturing flow associated therewith are found, e.g., in U.S. Pat. No. 9,256, 709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, an IC device includes a resistor including first and second metal segments extending in a first direction in a first metal layer and a third metal segment extending in a second direction perpendicular to the first direction in a second metal layer below the first metal layer, wherein the third metal segment is configured to electrically connect the first and second metal segments to each other, and a heat transfer structure electrically isolated from the resistor, the heat transfer structure including fourth and fifth metal segments extending in the first direction in the first metal layer adjacent to the first and second metal segments, respectively, sixth and seventh metal segments extending in the second direction in the second metal layer, wherein each of the sixth and seventh metal segments is configured to electrically connect the fourth and fifth metal segments to each other, and a thermally conductive path extending from one of the sixth or seventh metal segments to an underlying active area. In some embodiments, the resistor is a first resistor, and the IC device includes a second resistor including eighth and ninth metal segments extending in the first direction in the first metal layer and a tenth metal segment extending in the second direction in the second metal layer, wherein the tenth metal segment is configured to electrically connect the eighth and ninth metal segments to each other. In some embodiments, the second metal segment overlies the tenth metal segment. In some embodiments, the first and second metal segments correspond to a first pattern of a multiple patterning manufacturing process, and the fourth and fifth metal segments correspond to a second pattern of the multiple patterning manufacturing process. In some embodiments, the sixth metal segment corresponds to the first pattern and the seventh metal segment corresponds to the second pattern. In some embodiments, the first and second metal layers are adjacent metal layers. In some embodiments, the resistor includes an eighth metal segment extending in the first direction in the first metal layer and a ninth metal segment extending in the second direction in the second metal layer and configured to electrically connect the second and eighth metal segments to each other, and the heat transfer structure includes a tenth metal segment extending in the first direction in the first metal layer between the second and eighth metal segments, wherein each of the sixth and seventh metal segments is further configured to electrically connect the tenth metal segment to each of the fourth and fifth metal segments. In some embodiments, each of the sixth and seventh metal segments extends between the third and ninth metal segments. In some embodiments, the resistor includes first via structures positioned at locations at which each of the first and second metal segments overlies the third metal segment, and the heat transfer structure includes second via structures positioned at locations at which each of the fourth and fifth metal segments overlies each of the sixth and seventh metal segments. In some embodiments, the thermally conductive path is configured to contact the underlying active area comprising first and second source/drain structures.

In some embodiments, an IC device includes a resistor including first and second metal segments extending in a first direction in a fifth lowest metal layer of the IC device and a third metal segment extending in a second direction perpendicular to the first direction in a fourth lowest metal layer of the IC device, wherein the third metal segment is configured to electrically connect the first and second metal segments to each other, and a heat transfer structure electrically isolated from the resistor, the heat transfer structure including fourth and fifth metal segments extending in the first direction in the fifth lowest metal layer adjacent to the first and second metal segments, respectively, sixth and seventh metal segments extending in the second direction in the fourth lowest metal layer, wherein each of the sixth and seventh metal segments is configured to electrically connect the fourth and fifth metal segments to each other, and a thermally conductive path extending from one of the sixth or seventh metal segments to an underlying active area, wherein the thermally conductive path comprises eighth through tenth metal segments in corresponding first through third lowest metal layers of the IC device. In some embodiments, the resistor is a first resistor, and the IC device includes a second resistor including eighth and ninth metal segments extending in the first direction in the fifth lowest metal layer and a tenth metal segment extending in the second direction in the fourth lowest metal layer and configured to electrically connect the eighth and ninth metal segments to each other. In some embodiments, the resistor includes a first via structure positioned between and electrically connected to each of the first and third metal segments and a second via structure positioned between and electrically connected to each of the second and third metal segments, and the heat transfer structure includes a third via structure positioned between and electrically connected to each of the fourth and sixth metal segments, a fourth via structure positioned between and electrically connected to each of the fourth and seventh metal segments, a fifth via structure positioned between and electrically connected to each of the fifth and sixth metal segments, and a sixth via structure positioned between and electrically connected to each of the fifth and seventh metal segments. In some embodiments, the thermally conductive path includes an MD segment positioned on the underlying active area, a first via structure positioned between and electrically connected to the MD segment and the eighth metal segment, a second via structure positioned between and electrically connected to the eighth and ninth metal segments, a third via structure positioned between and electrically connected to the ninth and tenth metal segments, and a fourth via structure positioned between and electrically connected to the tenth metal segment and the one of the sixth or seventh metal segments.

In some embodiments, an IC device includes a resistor including a plurality of first metal segments extending in a first direction in a first metal layer, a plurality of second metal segments extending in a second direction perpendicular to the first direction in a second metal layer below the first metal layer, each second metal segment being configured to electrically connect first pairs of the first metal segments to each other at first ends of the first metal segments, and a plurality of third metal segments extending in the second direction in the second metal layer, each third metal segment being configured to electrically connect second pairs of the first metal segments to each other at second ends of the first metal segments, and a heat transfer structure electrically isolated from the resistor, the heat transfer structure including a plurality of fourth metal segments extending in the first direction in the first metal layer between the plurality of first metal segments, a plurality of fifth metal segments extending in the second direction in the second metal layer, each fifth metal segment being electrically connected to each overlying fourth metal segment of the plurality of fourth metal segments, and a thermally conductive path extending from a fifth metal segment of the plurality of fifth metal segments to an underlying active area. In some embodiments, an entirety of the plurality of fifth metal segments is positioned between the plurality of second metal segments and the plurality of third metal segments. In some embodiments, the second metal segments of the plurality of second metal segments are aligned along the second direction, and the third metal segments of the plurality of third metal segments are aligned along the second direction. In some embodiments, each second metal segment of the plurality of second metal segments and each third metal segment of the plurality of third metal segments extends under a fourth metal segment of the plurality of fourth metal segments. In some embodiments, entireties of each of the resistor and the heat transfer structure are positioned within the fifth lowest metal layers of the IC device.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit (IC) device comprising:
a resistor comprising:
first and second metal segments extending in a first direction in a first metal layer; and
a third metal segment extending in a second direction perpendicular to the first direction in a second metal layer below the first metal layer, wherein the third metal segment is configured to electrically connect the first and second metal segments to each other; and
a heat transfer structure electrically isolated from the resistor, the heat transfer structure comprising:
fourth and fifth metal segments extending in the first direction in the first metal layer adjacent to the first and second metal segments, respectively;
sixth and seventh metal segments extending in the second direction in the second metal layer, wherein each of the sixth and seventh metal segments is configured to electrically connect the fourth and fifth metal segments to each other; and
a thermally conductive path extending from one of the sixth or seventh metal segments to an underlying active area.

2. The IC device of claim 1, wherein
the resistor is a first resistor, and
the IC device further comprises a second resistor comprising:
eighth and ninth metal segments extending in the first direction in the first metal layer; and
a tenth metal segment extending in the second direction in the second metal layer, wherein the tenth metal segment is configured to electrically connect the eighth and ninth metal segments to each other.

3. The IC device of claim 2, wherein
the second metal segment overlies the tenth metal segment.

4. The IC device of claim 1, wherein
the first and second metal segments correspond to a first pattern of a multiple patterning manufacturing process, and
the fourth and fifth metal segments correspond to a second pattern of the multiple patterning manufacturing process.

5. The IC device of claim 4, wherein
the sixth metal segment corresponds to the first pattern, and
the seventh metal segment corresponds to the second pattern.

6. The IC device of claim 1, wherein
the first and second metal layers are adjacent metal layers.

7. The IC device of claim 1, wherein
the resistor further comprises:

an eighth metal segment extending in the first direction in the first metal layer; and a ninth metal segment extending in the second direction in the second metal layer and configured to electrically connect the second and eighth metal segments to each other; and the heat transfer structure further comprises:

a tenth metal segment extending in the first direction in the first metal layer between the second and eighth metal segments, wherein each of the sixth and seventh metal segments is further configured to electrically connect the tenth metal segment to each of the fourth and fifth metal segments.

8. The IC device of claim 7, wherein
each of the sixth and seventh metal segments extends between the third and ninth metal segments.

9. The IC device of claim 1, wherein
the resistor further comprises:

first via structures positioned at locations at which each of the first and second metal segments overlies the third metal segment; and the heat transfer structure further comprises:

second via structures positioned at locations at which each of the fourth and fifth metal segments overlies each of the sixth and seventh metal segments.

10. The IC device of claim 1, wherein
the thermally conductive path is configured to contact the underlying active area comprising first and second source/drain structures.

11. An integrated circuit (IC) device comprising:
a resistor comprising:

first and second metal segments extending in a first direction in a fifth lowest metal layer of the IC device; and a third metal segment extending in a second direction perpendicular to the first direction in a fourth lowest metal layer of the IC device, wherein the third metal segment is configured to electrically connect the first and second metal segments to each other; and a heat transfer structure electrically isolated from the resistor, the heat transfer structure comprising:

fourth and fifth metal segments extending in the first direction in the fifth lowest metal layer adjacent to the first and second metal segments, respectively;

sixth and seventh metal segments extending in the second direction in the fourth lowest metal layer, wherein each of the sixth and seventh metal segments is configured to electrically connect the fourth and fifth metal segments to each other; and a thermally conductive path extending from one of the sixth or seventh metal segments to an underlying active area, wherein the thermally conductive path comprises eighth through tenth metal segments in corresponding first through third lowest metal layers of the IC device.

12. The IC device of claim 11, wherein
the resistor is a first resistor, and
the IC device further comprises a second resistor comprising:

eleventh and twelfth metal segments extending in the first direction in the fifth lowest metal layer; and a thirteenth metal segment extending in the second direction in the fourth lowest metal layer and configured to electrically connect the eleventh and twelfth metal segments to each other.

13. The IC device of claim 11, wherein
the resistor further comprises:

a first via structure positioned between and electrically connected to each of the first and third metal segments; and a second via structure positioned between and electrically connected to each of the second and third metal segments; and the heat transfer structure further comprises:

a third via structure positioned between and electrically connected to each of the fourth and sixth metal segments;

a fourth via structure positioned between and electrically connected to each of the fourth and seventh metal segments;

a fifth via structure positioned between and electrically connected to each of the fifth and sixth metal segments; and a sixth via structure positioned between and electrically connected to each of the fifth and seventh metal segments.

14. The IC device of claim 11, wherein the thermally conductive path further comprises:

a metal-like defined (MD) segment positioned on the underlying active area;

a first via structure positioned between and electrically connected to the MD segment and the eighth metal segment;

a second via structure positioned between and electrically connected to the eighth and ninth metal segments;

a third via structure positioned between and electrically connected to the ninth and tenth metal segments; and a fourth via structure positioned between and electrically connected to the tenth metal segment and the one of the sixth or seventh metal segments.

15. The IC device of claim 11, wherein
the thermally conductive path is configured to contact the underlying active area comprising one of a fin field-effect transistor (FinFET) or a gate-all-around (GAA) transistor.

16. An integrated circuit (IC) device comprising:
a resistor comprising:

a plurality of first metal segments extending in a first direction in a first metal layer;

a plurality of second metal segments extending in a second direction perpendicular to the first direction in a second metal layer below the first metal layer, each second metal segment being configured to electrically connect first pairs of the first metal segments to each other at first ends of the first metal segments; and a plurality of third metal segments extending in the second direction in the second metal layer, each third metal segment being configured to electrically connect second pairs of the first metal segments to each other at second ends of the first metal segments; and a heat transfer structure electrically isolated from the resistor, the heat transfer structure comprising:

a plurality of fourth metal segments extending in the first direction in the first metal layer between the plurality of first metal segments;

a plurality of fifth metal segments extending in the second direction in the second metal layer, each fifth metal segment being electrically connected to each overlying fourth metal segment of the plurality of fourth metal segments; and a thermally conductive path extending from a fifth metal segment of the plurality of fifth metal segments to an underlying active area.

17. The IC device of claim 16, wherein an entirety of the plurality of fifth metal segments is positioned between the plurality of second metal segments and the plurality of third metal segments.

18. The IC device of claim 16, wherein the second metal segments of the plurality of second metal segments are aligned along the second direction, and the third metal segments of the plurality of third metal segments are aligned along the second direction.

19. The IC device of claim 16, wherein each second metal segment of the plurality of second metal segments and each third metal segment of the plurality of third metal segments extends under a fourth metal segment of the plurality of fourth metal segments.

20. The IC device of claim 16, wherein entireties of each of the resistor and the heat transfer structure are positioned within the fifth lowest metal layers of the IC device.

* * * * *